(12) United States Patent
Konstantinov

(10) Patent No.: US 9,893,176 B2
(45) Date of Patent: Feb. 13, 2018

(54) SILICON-CARBIDE TRENCH GATE MOSFETS

(71) Applicant: FAIRCHILD SEMICONDUCTOR CORPORATION, Sunnyvale, CA (US)

(72) Inventor: Andrei Konstantinov, Sollentuna (SE)

(73) Assignee: Fairchild Semiconductor Corporation, Sunnyvale, CA (US)

( * ) Notice: Subject to any disclaimer, the term of this patent is extended or adjusted under 35 U.S.C. 154(b) by 0 days.

(21) Appl. No.: 15/275,184

(22) Filed: Sep. 23, 2016

(65) Prior Publication Data

US 2017/0012119 A1 Jan. 12, 2017

Related U.S. Application Data

(63) Continuation-in-part of application No. 14/744,958, filed on Jun. 19, 2015, now Pat. No. 9,466,709.
(Continued)

(51) Int. Cl.
*H01L 29/78* (2006.01)
*H01L 29/16* (2006.01)
(Continued)

(52) U.S. Cl.
CPC ........ *H01L 29/7803* (2013.01); *H01L 21/046* (2013.01); *H01L 21/047* (2013.01); *H01L 21/049* (2013.01); *H01L 21/0455* (2013.01); *H01L 21/0465* (2013.01); *H01L 29/0611* (2013.01); *H01L 29/0638* (2013.01); *H01L 29/1037* (2013.01); *H01L 29/1095* (2013.01); *H01L 29/167* (2013.01); *H01L 29/1608* (2013.01); *H01L 29/4236* (2013.01); *H01L 29/42368* (2013.01); *H01L 29/66068* (2013.01); *H01L 29/7813* (2013.01); *H01L 29/8083* (2013.01)

(58) Field of Classification Search
CPC ............. H01L 29/7803; H01L 29/0611; H01L 29/1037
See application file for complete search history.

(56) References Cited

U.S. PATENT DOCUMENTS 5,195,180 A 3/1993 Takakura et al.
5,506,421 A 4/1996 Palmour
(Continued)

OTHER PUBLICATIONS

Furuhashi, Masayuki et al., "Breakthrough in Trade-off between Threshold Voltage and Specific On-Resistance of SiC-MOSFETs", Proceedings of The 25th International Symposium on Power Semiconductor Devices & ICs, pp. 55-58, 2013.
(Continued)

*Primary Examiner* — Matthew Reames
(74) *Attorney, Agent, or Firm* — Brake Hughes Bellermann LLP

(57) ABSTRACT

In a general aspect, an apparatus can include a silicon carbide (SiC) trench gate MOSFET with improved operation due, at least in part, to a reduced gate capacitance. In the SiC trench gate MOSFET, a thick gate oxide can be formed on a bottom surface of the gate trench and a built-in channel, having a vertical portion and a lateral portion, can be formed to electrically connect a vertical inversion-layer channel, such as in a channel stopper layer, to a vertical JFET channel region and a drift region.

21 Claims, 37 Drawing Sheets

Related U.S. Application Data

(60) Provisional application No. 62/096,943, filed on Dec. 26, 2014.

(51) Int. Cl.

| | | |
|---|---|---|
| *H01L 29/06* | (2006.01) | |
| *H01L 29/423* | (2006.01) | |
| *H01L 29/66* | (2006.01) | |
| *H01L 21/04* | (2006.01) | |
| *H01L 29/10* | (2006.01) | |
| *H01L 29/167* | (2006.01) | |
| *H01L 29/808* | (2006.01) | |

(56) References Cited

U.S. PATENT DOCUMENTS

| | | |
|---|---|---|
| 5,831,288 A | 11/1998 | Singh et al. |
| 5,963,807 A * | 10/1999 | Ueno ............... H01L 29/0623 257/E21.066 |
| 5,976,936 A | 11/1999 | Miyajima et al. |
| 7,989,882 B2 | 8/2011 | Zhang et al. |
| 9,466,709 B2 | 10/2016 | Konstantinov |
| 2010/0193799 A1 | 8/2010 | Nakano et al. |
| 2012/0161154 A1 | 6/2012 | Mimura et al. |
| 2013/0153999 A1 | 6/2013 | Zhang et al. |
| 2015/0214061 A1* | 7/2015 | Zhou ............... H01L 29/42368 257/330 |
| 2015/0340487 A1 | 11/2015 | Esteve et al. |
| 2016/0190308 A1 | 6/2016 | Konstantinov |

OTHER PUBLICATIONS

Kimoto, Tsunenobu et al., "Physics of Sic MOS Interface and Development of Trench MOSFETs", pp. 135-138, IEEE 2013.

Tamaso, et al., "Ti/Al/Si Ohmic Contacts for Both n-Type and p-Type 4H-SiC", Materials Science Forum vols. 778-780 (2014) pp. 669-672.

Yano, Hiroshi et al., "Interface properties in metal-oxide-semiconductor structurs on n-type 4H-SiC(0338)", Applied Physics Letters, vol. 81, No. 25, Dec. 16, 2002, 3 pages.

Nakamura et al., "High Performance Sic Trench Devices with Ultra-low Ron"; IEDM-2011, 3 pages.

* cited by examiner

SILICON-CARBIDE TRENCH GATE MOSFETS

CROSS-REFERENCE TO RELATED APPLICATIONS

This application is continuation-in-part of U.S. patent application Ser. No. 14/744,958, filed on Jun. 9, 2015, entitled "SILICON-CARBIDE TRENCH GATE MOSFETS", now U.S. Pat. No. 9,466,709, which claims the benefit of and priority to U.S. Provisional Application No. 62/096,943, filed Dec. 26, 2014, also entitled "SILICON-CARBIDE TRENCH GATE MOSFETS", the contents of which are both hereby incorporated by reference in their entirety.

TECHNICAL FIELD

This description relates to power semiconductor devices. In particular, the description relates to trench gate power metal-oxide-semiconductor field effect transistors that can be implemented in a silicon carbide substrate.

BACKGROUND

The performance of silicon carbide (SiC) power metal-oxide-semiconductor field effect transistor (MOSFETs) can be impacted, as compared with theoretical performance parameters of such devices, due, at least in part, to imperfections of a MOS interface, such as an interface between SiC material and gate a dielectric (e.g., gate oxide), of a MOSFET implemented in SiC. While inversion-layer mobility for lateral crystal faces in SiC devices does not significantly affect performance for a SiC MOSFET (e.g., lateral MOSFET) having a low (e.g., 5 volts) threshold voltage (Vt), devices with such Vt values do not meet the performance and reliability requirements of many power MOSFET application (e.g., operating voltages of 100 V or greater). For example, at such operating voltages, a low Vt device may be normally on, e.g., regardless of applied gate voltage.

However, merely increasing the Vt of such devices may not allow for achieving desired performance parameters due, at least in part, to the fact that inversion-layer mobility in SiC (e.g., in lateral SiC crystal faces) rapidly decreases with increasing Vt, leading to a number of difficult tradeoff decisions when designing SiC power MOSFETs. Such decreases in carrier mobility due to increases in Vt may be due, at least in part, to scattering mobile charge carriers at areas of trapped interface charge.

Vertical SiC crystal faces (e.g., crystal faces 11-20) tend to have better tradeoffs between mobility and Vt. Accordingly, trench gate MOSFETs can benefit from this better Vt tradeoff (e.g., due to having a vertical channel). Unfortunately, trench gate MOSFETs can be difficult to implement in SiC due to other reliability concerns. For instance, electric fields in SiC MOSFETs are on the order of ten times higher than in similar devices in silicon (Si) substrates. These increased electric fields can cause reliability issues in SiC trench gate MOSFETs, such as susceptibility to voltage breakdown damage at the corners of the trench gate (e.g., due to electric field crowding).

SUMMARY

In a general aspect, an apparatus can include a silicon-carbide (SiC) substrate of a first conductivity type, a drift region of the first conductivity type disposed on the SiC substrate and a junction field-effect transistor (JFET) channel region of the first conductivity type disposed on the drift region. A shielding body region of a second conductivity type can be disposed in the JFET channel region. A channel stopper layer of the second conductivity type can be disposed on the shielding body region and a source region of the first conductivity type can be disposed on the channel stopper layer. A gate trench can extend through the source region and the channel stopper layer. The gate trench can terminate in the JFET region and have a sidewall and a bottom surface. The apparatus can also include a built-in channel of the first conductivity type disposed below the gate trench. The built-in channel can have a sidewall portion disposed along at least a portion of the sidewall of the gate trench and a lateral portion disposed along at least a portion of the bottom surface of the gate trench. The apparatus can also include a gate dielectric with a sidewall portion disposed on the sidewall of the gate trench and a lateral portion disposed on the bottom surface of the trench. The lateral portion of the gate dielectric can have a thickness that is greater than or equal to two times a thickness of the sidewall portion of the gate dielectric. The apparatus can further include a gate electrode disposed on the gate dielectric.

Implementations can include one or more of the following features. For instance, a doping concentration of the channel stopper layer can be greater than a doping concentration of the shielding body region. A doping concentration of the lateral portion of the built-in channel can be greater than a doping concentration of the sidewall portion of the built-in channel. A threshold voltage of the lateral portion of the built-in channel can be lower than a threshold voltage of the sidewall portion of the built-in channel. The first conductivity type can be n-type and the second conductivity type can be p-type. The built-in channel can continuously extend from the channel stopper layer, through the shielding body region and into the JFET channel region.

The sidewall of the gate trench can define an angle of greater than 90 degrees with the bottom surface of the gate trench. The sidewall of the gate trench can define an angle of approximately 90 degrees with the bottom surface of the gate trench.

The apparatus can include a sub-contact implant region of the second conductivity type disposed in the channel stopper layer. The sub-contact implant region can be disposed adjacent to the source region and the source region can be disposed between the sub-contact implant region and the gate trench. The apparatus can include a contact layer disposed on at least a portion of the sub-contact implant region and disposed on at least a portion of the source region. The contact layer can establish a first ohmic contact with the sub-contact implant region and can establish a second ohmic contact with the source region.

A doping concentration of the JFET channel region can be equal to a doping concentration of the drift region. A doping concentration of the JFET channel region can be greater than a doping concentration of the drift region.

The sidewall portion of the gate dielectric can be disposed, within the gate trench, on the source region, on the channel stopper layer and on at least a portion of the sidewall portion of the built-in channel. The lateral portion of the gate dielectric can be disposed on the lateral portion of the built-in channel.

The gate trench can be a first trench, and the apparatus can include a second trench extending through the source region and the channel stopper layer. The second trench can terminate in the shielding body region. A sub-contact implant region of the second conductivity type can be disposed in the shielding body region. The apparatus can include a linking implant of the first conductivity type. The linking implant can extend from the sub-contact implant region to the source region. The linking implant can have a lateral portion and a vertical portion. A contact layer can be disposed on at least a portion of the sub-contact implant region and can be disposed on at least a portion of the linking implant. The contact layer can establish a first ohmic contact with the sub-contact implant region and can establish a second ohmic contact with the source region via the linking implant.

The shielding body region can include a first shielding body region and a second shielding body region disposed on the first shielding body region. The second shielding body region can be disposed in an epitaxial layer of the first conductivity type that is disposed between the JFET channel region and the channel stopper layer.

In another general aspect, an apparatus can include a silicon-carbide (SiC) substrate of a first conductivity type, a drift region of the first conductivity type disposed in the SiC substrate and a junction field-effect transistor (JFET) channel region of the first conductivity type disposed in the SiC substrate above the drift region. The apparatus can also include a shielding body region of a second conductivity type disposed in the JFET channel region, a channel stopper layer of the second conductivity type disposed on the shielding body region and a source region of the first conductivity type disposed on the channel stopper layer. The apparatus can further include a gate trench extending through the source region and the channel stopper layer. The gate trench can terminate in the JFET region, and can have a sidewall and a bottom surface. The sidewall of the gate trench can define an angle of greater than 90 degrees with the bottom surface of the gate trench. The apparatus can still further include a built-in channel of the first conductivity type disposed below the gate trench. The built-in channel can have a sidewall portion disposed along at least a portion of the sidewall of the gate trench and a lateral portion disposed along at least a portion of the bottom surface of the gate trench. The lateral portion of the built-in channel can have a threshold voltage that is less than a threshold voltage of the sidewall portion of the built-in channel. The apparatus can also include a gate dielectric having a sidewall portion disposed on the sidewall of the gate trench and a lateral portion disposed on the bottom surface of the trench. The lateral portion of the gate dielectric can have a thickness that is greater than or equal to two times a thickness of the sidewall portion of the gate dielectric. The apparatus can also further include a gate electrode disposed on the gate dielectric within the gate trench.

Implementations can include one or more of the following features. For instance, the lateral portion of the gate dielectric can include a field oxide. The thickness of the lateral portion of the gate dielectric can be greater than or equal to three times the thickness of the sidewall portion of the gate dielectric.

The gate trench can be a first trench. The apparatus can include a second trench extending through the source region and the channel stopper layer. The second trench can terminate in the shielding body region. A sub-contact implant region of the second conductivity type can be disposed in the shielding body region. A linking implant of the first conductivity type can extend from the sub-contact implant region to the source region. The linking implant can have a lateral portion and a vertical portion. A contact layer can be disposed on at least a portion of the sub-contact implant region and can be disposed on at least a portion of the linking implant. The contact layer can establish a first ohmic contact with the sub-contact implant region and can establish a second ohmic contact with the source region via the linking implant.

In another general aspect, an apparatus can include a silicon-carbide (SiC) substrate of a first conductivity type, a drift region of the first conductivity type disposed in the SiC substrate and a junction field-effect transistor (JFET) channel region of the first conductivity type disposed in the SiC substrate above the drift region. The apparatus can also include a shielding body region of a second conductivity type disposed in the JFET channel region. The apparatus can further include a channel stopper layer of the second conductivity type disposed on the shielding body region and a source region of the first conductivity type disposed on the channel stopper layer. The apparatus can also further include a gate trench extending through the source region and the channel stopper layer. The gate trench can terminate in the JFET region, and have a sidewall and a bottom surface. The sidewall of the gate trench can define an angle of approximately 90 degrees with the bottom surface of the gate trench. The apparatus can still further include a built-in channel of the first conductivity type disposed below the gate trench. The built-in channel can have a vertical portion disposed along at least a portion of the sidewall of the gate trench and a lateral portion disposed along at least a portion of the bottom surface of the gate trench. The lateral portion of the built-in channel can have a threshold voltage that is less than a threshold voltage of the vertical portion of the built-in channel. The vertical portion of the built-in channel can be disposed below the channel stopper layer. The apparatus can further include a gate dielectric having a sidewall portion disposed on the sidewall of the gate trench and a lateral portion disposed on the bottom surface of the trench. The lateral portion of the gate dielectric can have a thickness that is greater than or equal to two times a thickness of the sidewall portion of the gate dielectric. A gate electrode can be disposed on the gate dielectric within the gate trench.

Implementations can include one or more of the following features. For instance, the shielding body region can include a first shielding body region and a second shield body region disposed on the first shielding body region. The second shielding body region can be disposed in an epitaxial layer of the first conductivity type that is disposed between the JFET channel region and the channel stopper layer.

DETAILED DESCRIPTION

Figure 1:
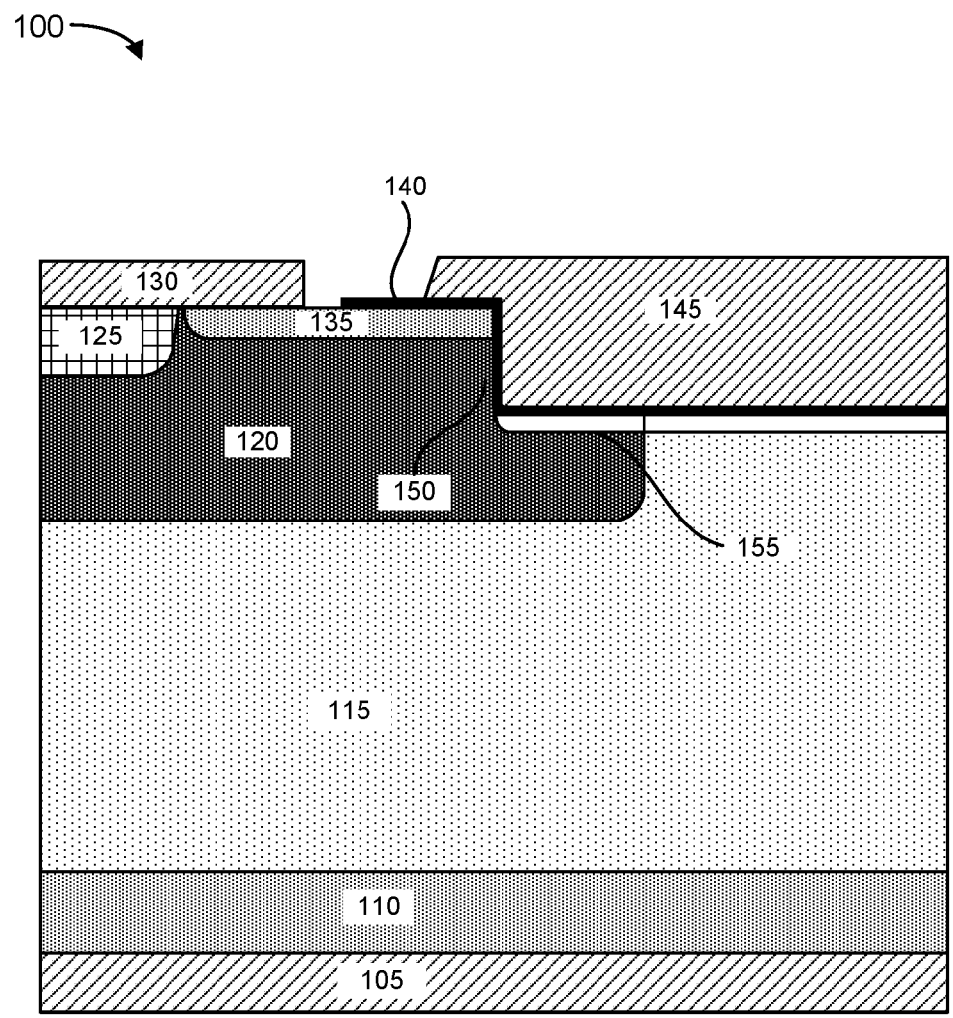
FIG. 1 is a cross-sectional diagram illustrating a silicon-carbide (SiC) trench gate power metal-oxide-semiconductor field effect transistor (MOSFET), according to an implementation.

Due to the electrical characteristics of SiC, it is desirable to produce power switches, such as MOSFET power switches, in SiC. However, as noted above, inversion-layer mobility in SiC is a strong function of Vt, especially for lateral SiC crystal faces. Accordingly, lateral SiC MOSFETS with a Vt that is suitable for use as a power switch (e.g., Vt above 5 Volts) tend to have very low inversion-layer mobility and, therefore, can have poor performance characteristics, such as high drain-to-source on-resistance (Rdson).

As an example, mobility for a planar (0001) Si-face in SiC can have channel carrier (e.g., electron) mobility below 5-10 cm2/Vs. In comparison, if the a-plane (1-100) face of SiC is used for a MOSFET channel, the inversion-layer electron mobility is 4 to 5 times higher than that for the Si-face for the same p-type doping and the same threshold voltage Vt. This improved vertical carrier mobility can be advantageous in a trench gate MOSFET design implemented in SiC. However, SiC trench gate MOSFET devices can have reliability concerns, such as those discussed herein.

Various implementations of SiC trench gate power MOSFETs are illustrated in the attached drawings and described in the following discussion. In the illustrated implementations, the devices are illustrated as "half cells", where a "full cell" can be produced using two half cells, where one half cell is a mirror image of the other. Larger SiC trench gate MOSFETs can be produced using multiple full cells in combination. Accordingly, the half cells shown in the drawings and described herein are given by way of example and for purposes of illustration. That is, a SiC trench gate MOSFET device of a desired size can be produced using an appropriate number of half cells (and their mirror images) to produce a device of a desired size.

The SiC trench gate MOSFETs described herein can address, at least in part, the issues discussed above (e.g., carrier mobility to Vt tradeoff and reliability issues). In these implementations, a SiC trench gate MOSFET can include a vertical, normally off inversion channel (e.g., along a gate trench sidewall) and a self-aligned (e.g., implanted) lateral MOS channel. In such implementations, the lateral MOS channel may have a lower Vt than the vertical channel, or can be normally on (e.g., regardless of gate electrode bias).

In such implementations, doping in the lateral MOS channel can be achieved using ion implantation, where that ion implantation is done using an implantation beam that is normal or at a near-normal angle to the surface of the device. As is described herein (and shown in the drawings), this allows the lateral channel structure to be a "self-aligned" structure, which can allow for achieving very short channel lengths without having to perform submicron patterning to form the lateral MOS channel.

One benefit of such trench gate devices, as compared to lateral devices, is lower channel on-state resistance (Rdson) due to taking advantage of a better tradeoff between electron mobility and threshold voltage in the vertical channel. In such approaches, the inversion channel can be very short, for example between 50 nanometers (nm) and 500 nm, which can further improve (e.g., reduce) Rdson.

One reason why such SiC MOSFET devices can have advantages over conventional designs is due, at least in part, to properties of the inversion channel mobility in 4H SiC. Namely, (i) mobility rapidly decreases with increasing threshold voltage (Vt); and (ii) mobility along the trench sidewalls is much higher than the in-plane mobility for a same Vt. Such SiC MOSFET devices, e.g., those described herein, therefore, can have lower Rdson as compared to conventional SiC MOSFET devices.

FIG. 1 is a cross-sectional diagram illustrating a silicon-carbide (SiC) trench gate power metal-oxide-semiconductor field effect transistor (MOSFET) device 100, according to an implementation. The device 100 in FIG. 1 is an n-channel SiC trench gate FET with a vertical-inversion channel and a self-aligned, and n-doped lateral channel portion (lateral channel region, etc.). In other implementations, a p-channel device could be produced using similar approaches to those described herein. Likewise, P-channel devices similar to those illustrated in the other drawings can also be produced.

Figure 2:
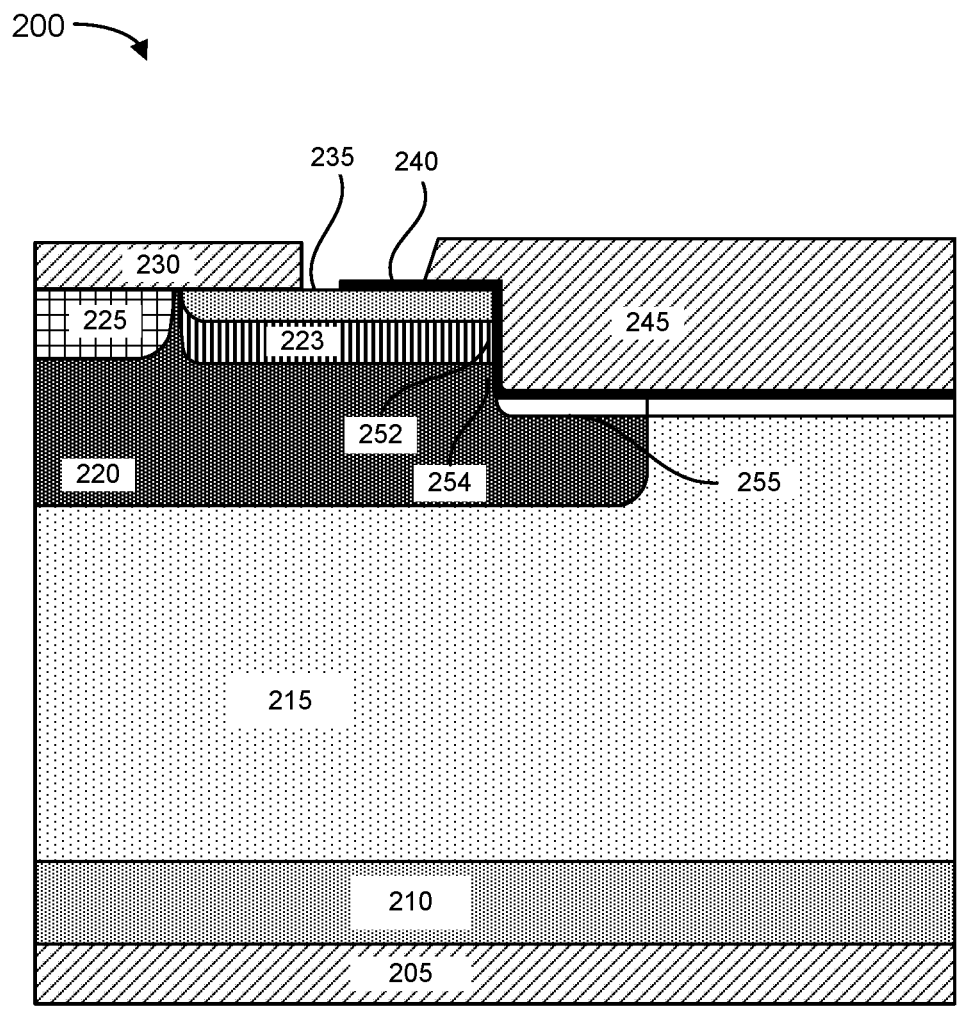
FIG. 2 is a cross-sectional diagram illustrating another SiC trench gate power MOSFET, according to an implementation.

As with each of the device implementations illustrated herein, the device 100 in FIG. 1 can include a backside drain contact 105, a heavily doped n-type (n+) substrate 110, an n-type (e.g., lightly doped) drift region 115, a p-type body region 120, a sub-contact p-type implant 125 (for forming an ohmic contact), a source and body contact 130 (ohmic contact), an n-type (n+) source region 135, a gate dielectric 140 and a gate electrode 145. For brevity, each of these elements is not discussed with respect to each of the illustrated implementations. Analogous (corresponding, etc.) features in FIG. 2 are referenced with like 200 series reference numbers, in FIGS. 3A-3F with like 300 series reference numbers and in FIG. 4 with like 400 series reference numbers. Further, in FIGS. 3A-3F, for purpose of clarity, the substrate and ohmic contact 130 to the source region 135 and the body region 120 (including the sub-contact implant 125) are not illustrated. Further in FIGS. 3A-3F, certain references numbers are not repeated in the various views.

The device 100 of FIG. 1 can overcome reliability concerns associated with voltage breakdown related damage occurring at the corner of a gate trench, as the gate trench corner is located within the p-type body region 120 (which can also be referred to as a p-type depletion stopper). This provides shielding (from the drift region 115) for the trench corner, which reduces field crowding at the trench corner, thus reducing the risk of voltage breakdown related damage.

In the device of FIG. 1 (and other devices described herein), the inversion layer of the device conduction channel consists of, at least, two portions (sections). For instance, the inversion layer of the device conduction channel (channel) can include a vertical portion 150 along the vertical sidewall of the gate trench and below the n+ source region 135. This vertical portion 150 of the channel can have a high Vt (e.g., >5 volts) and also have high carrier mobility, due to higher carrier mobility in vertical SiC crystal faces.

The channel of the device 100 in FIG. 1 can also include a lateral portion (or region) 155 (e.g., with low carrier mobility). The lateral portion 155 of the channel of the device 100 in FIG. 1 can be defined along an interface of the lateral portion of the gate dielectric 140 with the p-body region 120 (e.g., along a portion of the bottom of the gate trench). Carrier mobility in this lateral portion 155 of the channel can be improved by decreasing a Vt of the lateral portion 155, so as to increase channel carrier mobility within the lateral portion 155 of the channel. Such a reduction in Vt can be achieved using ion implantation to define the lateral portion 155 as an n-doped portion along the lateral surface of p-body region 120 and the drift region 115 that is disposed below the lateral portion of the gate dielectric 140 (e.g., below the gate trench), as is shown in FIG. 1. Such an approach is further described with respect to FIG. 3D. Depending on the particular implementation, the n-doped lateral portion 155 (e.g., created by ion implantation) can extend completely across the interface between a bottom surface of the gate trench and the drift region 115 or can terminate within the drift region 115, e.g., at some predetermined distance from the edge of the p-type body region 120.

Depending on the implementation, the lateral portion 155 of the channel can have a lower Vt than the vertical portion 150 of the channel, or can be normally on (e.g., regardless of a bias on gate electrode 145 within normal operating conditions). Such an arrangement for a SiC power MOSFET device can have a lower Rdson than a lateral SiC power MOSFET device, where its lateral channel has a high Vt and associated low channel carrier mobility.

FIG. 2 is a cross-sectional diagram illustrating another SiC trench gate power MOSFET device 200, according to an implementation. As compared with the device 100 illustrated in FIG. 1, the device 200 shown in FIG. 2 can be implemented with a conduction channel that has, at least, three portions. Briefly, as with the device 100 illustrated in FIG. 1, the device 200 shown in FIG. 2 can include a backside drain contact 205, a heavily doped n-type (n+) substrate 210, an n-type (e.g., lightly doped) drift region 215, a p-type body region 220, a sub-contact p-type implant 225 (for forming an ohmic contact), a source and body contact 230 (ohmic contact), an n-type (n+) source region 235, a gate dielectric 240 and a gate electrode 245. For brevity, as noted above, each of these elements may not be specifically discussed with respect to the device 200 of FIG. 2.

A channel of the device 200 of FIG. 2 can include a lateral channel portion (lateral portion, lateral channel region, lateral region, etc.) 255 that is similar to the lateral channel portion 155 of the device shown in FIG. 1 and described above. In contrast with the device 110 shown in the FIG. 1, a channel of the device 200 can include a vertical portion that has more than one region. For instance, the vertical portion of the channel of the device 200 can include a first region 252 having a highest threshold of the three portions of the channel (e.g., two vertical portions and the lateral portion 255) shown in FIG. 2. The first region 252 of the vertical portion of the channel can be defined by a shallow implant 223 (p-body 2) that has a higher surface doping concentration than the p-body region 220 (e.g., such as the p-body region 120 of the device 100 shown in FIG. 1). The doping concentration of the implant 223 can be used adjust (control) a threshold voltage (Vt) of the device 200. Accordingly, according the implant 223 can be referred to as a threshold control implant 223.

The vertical portion of the channel of the device in FIG. 2 can also include a second region 254 that is defined by the p-body region 220 (which has a lower acceptor doping concentration than the p-body 2 region 223) and the vertical portion of the gate trench that is disposed below the p-body 2 region 223. In the device 200 of FIG. 2, a Vt of the device 200 can be controlled by (established by) the p-body 2 implant region 223, e.g., based on a doping concentration of the p-body 2 implant region 223. Such an approach may allow for producing a SiC power MOSFET device with a very short effective channel length, for example, between approximately 50 nm and 500 nm.

FIGS. 3A-3F are cross-sectional diagrams illustrating a semiconductor process flow for producing a SiC trench gate power MOSFET device 300, according to an implementation. The semiconductor processing operations of FIGS. 3A-3F are shown in schematic form. It is noted that the specifics of a given semiconductor process operation can vary depending on the particular device being implemented and/or on the specific semiconductor process that is used to produce a given SiC trench gate power MOSFET device.

FIGS. 3A-3F illustrate a semiconductor process flow for producing a SiC trench gate power MOSFET device 300 that includes an inclined gate trench sidewall. In such implementations, at least a part of a vertical (inclined) portion of the channel, as well as a lateral portion of the channel are implanted with donors (e.g., to create an n-doped portion of the channel). However, in such approaches, the lateral portion of the channel can receive a higher dose than the gate trench sidewall, due to the inclination of the sidewall resulting in attenuation of the implant beam. Depending on the implementation, the gate trench sidewall can have an angle (e.g., from vertical) that is greater than 40 degrees (e.g., an angle of greater than 90 degrees with a bottom surface of the gate trench). In some implementations, the central part of the n-region along the gate trench bottom and over the drift region can be masked, so as not to receive the donor (n-type) channel implant. Such an approach can reduce the peak electric field in the drift region and reduce risk of damage due to voltage breakdown.

Figure 3A:
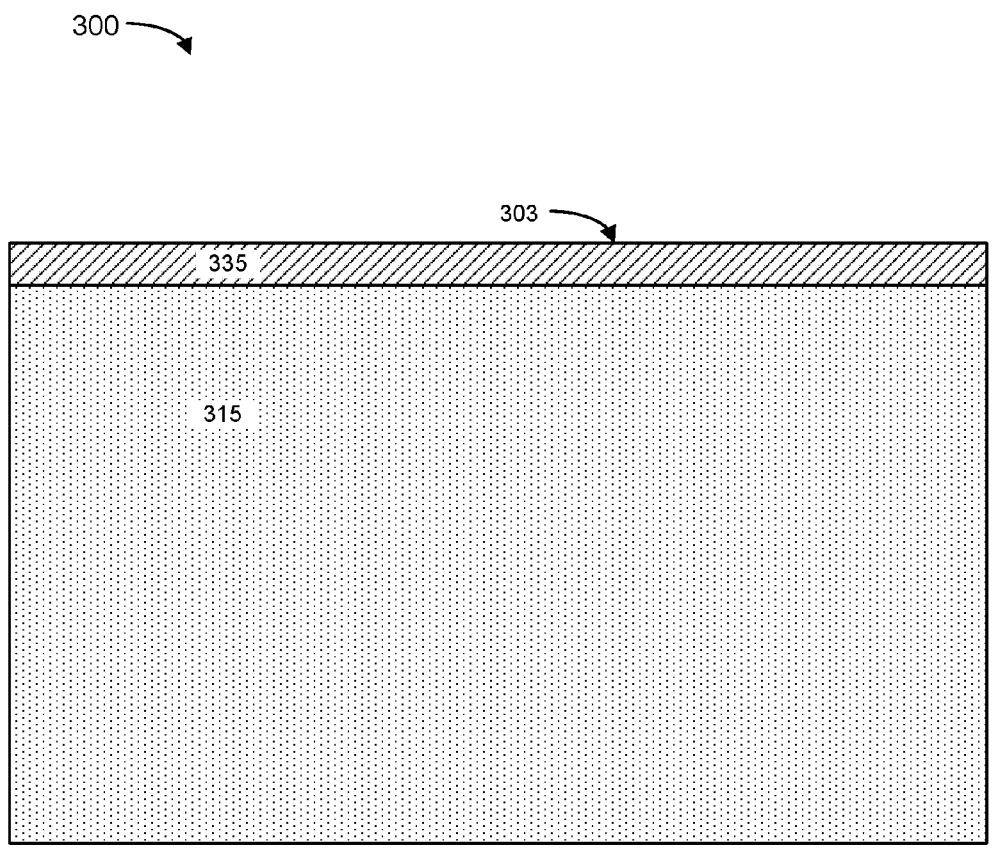
FIGS. 3A-3F are cross-sectional diagrams illustrating a semiconductor process flow for producing a SiC trench gate power MOSFET, according to an implementation.
Figure 3B:
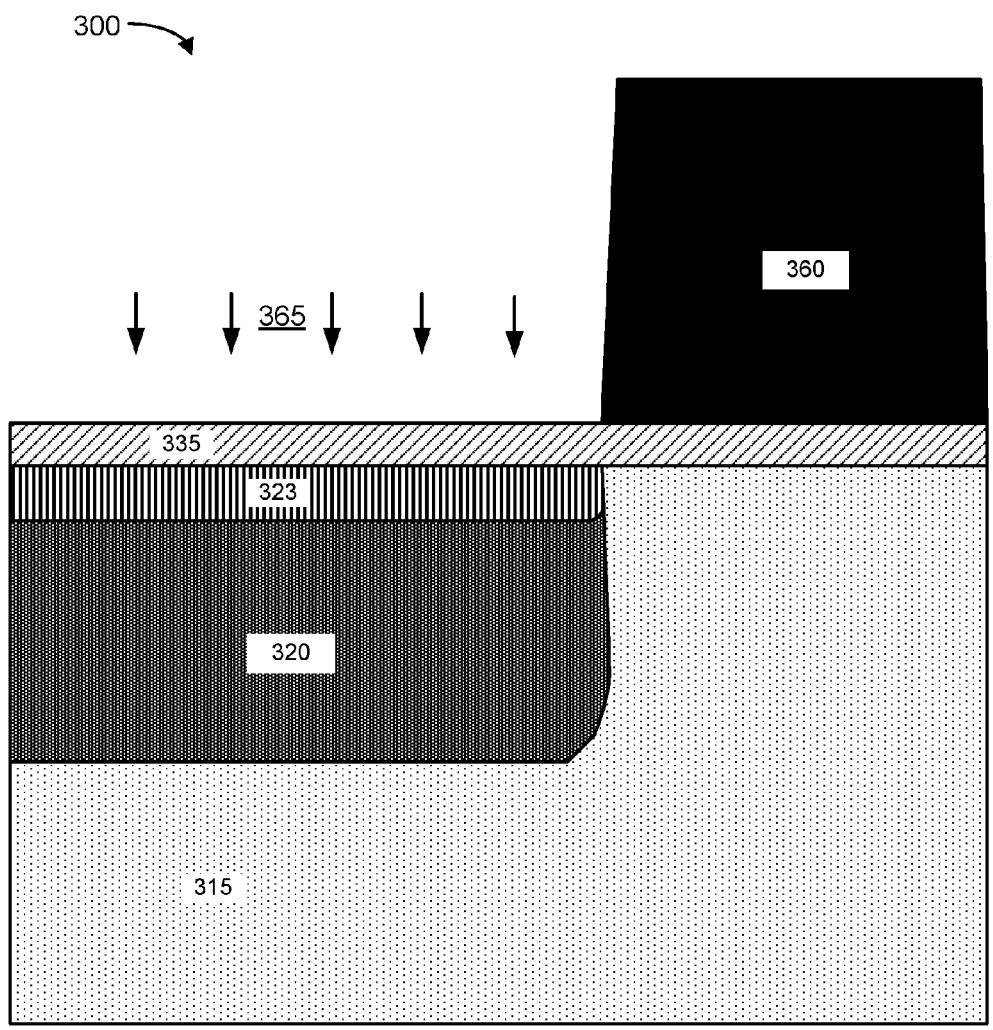

In FIG. 3A, a starting material 303 is illustrated. The starting material 303 can be an epitaxial SiC wafer (e.g., n-type in this example) that includes a drift region 315 (n-type drift region) and an n+ source layer 335. Depending on the particular approach, the n+ source layer 335, rather than being epitaxially formed, can be formed using ion implantation. As shown in FIG. 3B, a mask 360 can be formed and a deep p-body region 320 (p-type shielding body), as defined by the mask 360, can be formed in the starting material 303. The p-body region 320 can be formed using ion implantation 365 (e.g., such as by implanting aluminum (Al) ions). As also illustrated in FIG. 3B, a p-body 2 region 323 (with a higher doping concentration (e.g., surface doping concentration) than a doping concentration (e.g., surface doping concentration) of the p-body region 320) can also be formed using the same mask 360.

Figure 3C:
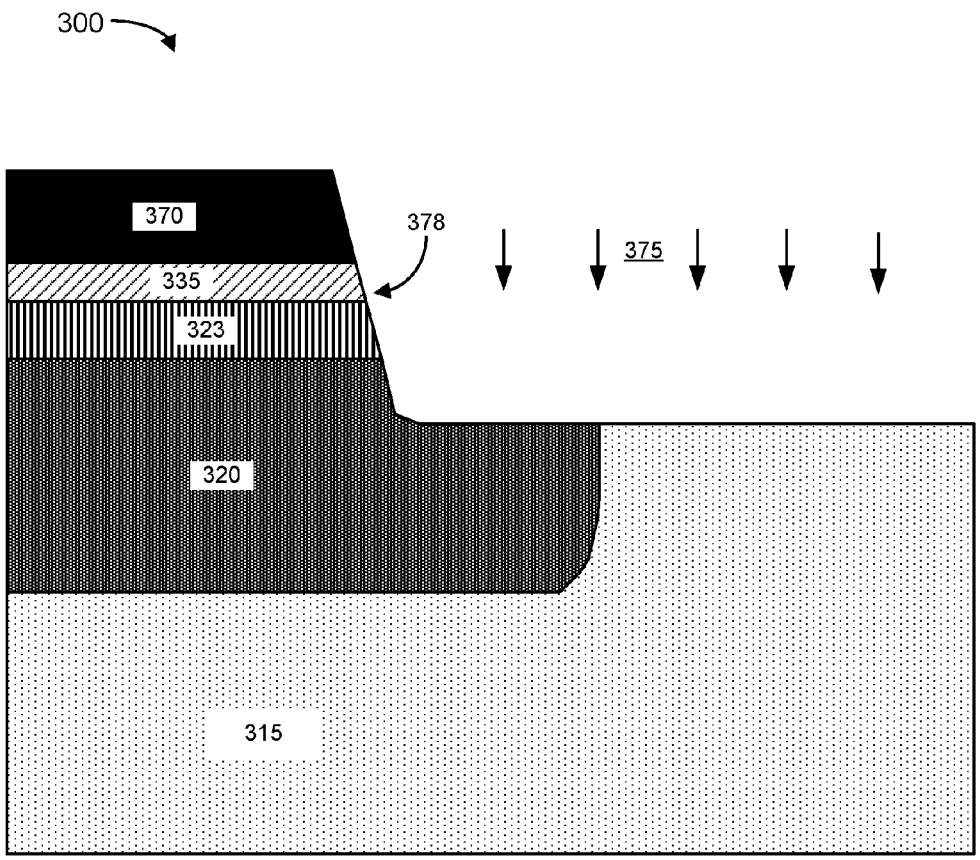

As shown in FIG. 3C, the mask 360 of FIG. 3B can be removed and an oxide mask 370 can be formed on the n+ source region 335. A mesa etch 375 can then be performed to produce an inclined gate trench sidewall 378, as shown in FIG. 3C. After performing the mesa etch 375, a high temperature anneal for implanted dopant activation (e.g., at a temperature of greater than 1500° C.) can be performed to activate the dopants from implanted and/or included in epitaxial formed layers in previous processing operations, which can also repair damage (e.g., implant and/or etch damage) to the SiC structure.

Figure 3D:
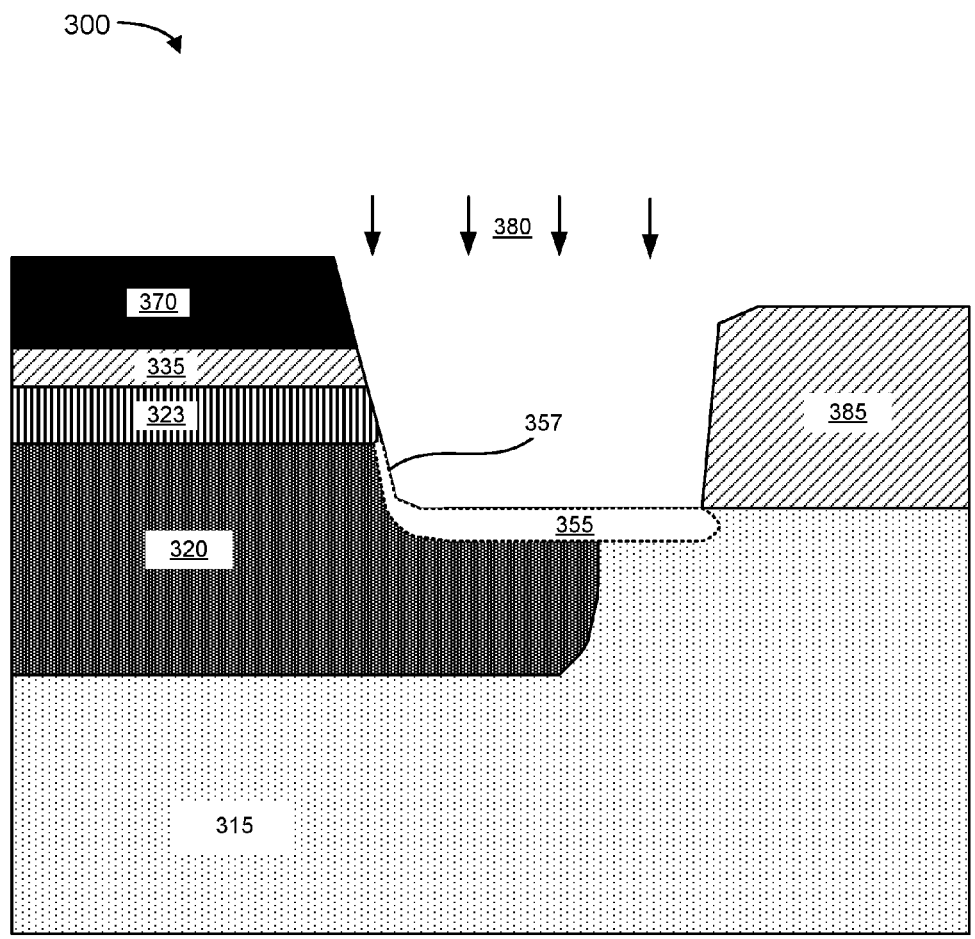

As illustrated in FIG. 3D, a nitrogen ion implant 380 can then be performed. The implant 380 can be done with a low dopant dose (e.g., a dose below $1 \times 10^{13}/cm^2$). The implant 380 can lower a Vt in the lateral channel portion (and in the implanted portion of the inclined gate trench sidewall). As discussed above, a mask 385 (e.g., a resist mask) can be used to prevent the nitrogen implant 380 from being performed in the center of the drift region 315 (e.g., of a full cell). As previously discussed, such an approach may reduce the peak electric field in this portion of the drift region 315, which can reduce the risk of damage due to breakdown (e.g., under reverse-bias conditions). For instance, the regions in the center of a vertical JFET channel (in a so-called JFET region, e.g., the area of the drift region 315 between p-body regions 320 in a full cell) can be exposed to high electric field under reverse-bias conditions, even in spite of the shielding regions of the p-implant. In some implementations, it can be desirable that a lateral extension defined by the nitrogen implant 380 in the JFET region does not exceed approximately one-sixth ($\frac{1}{6}^{th}$) of the JFET region width from each side (e.g., edge of the p-body regions 320 in a full-cell).

Figure 3E:
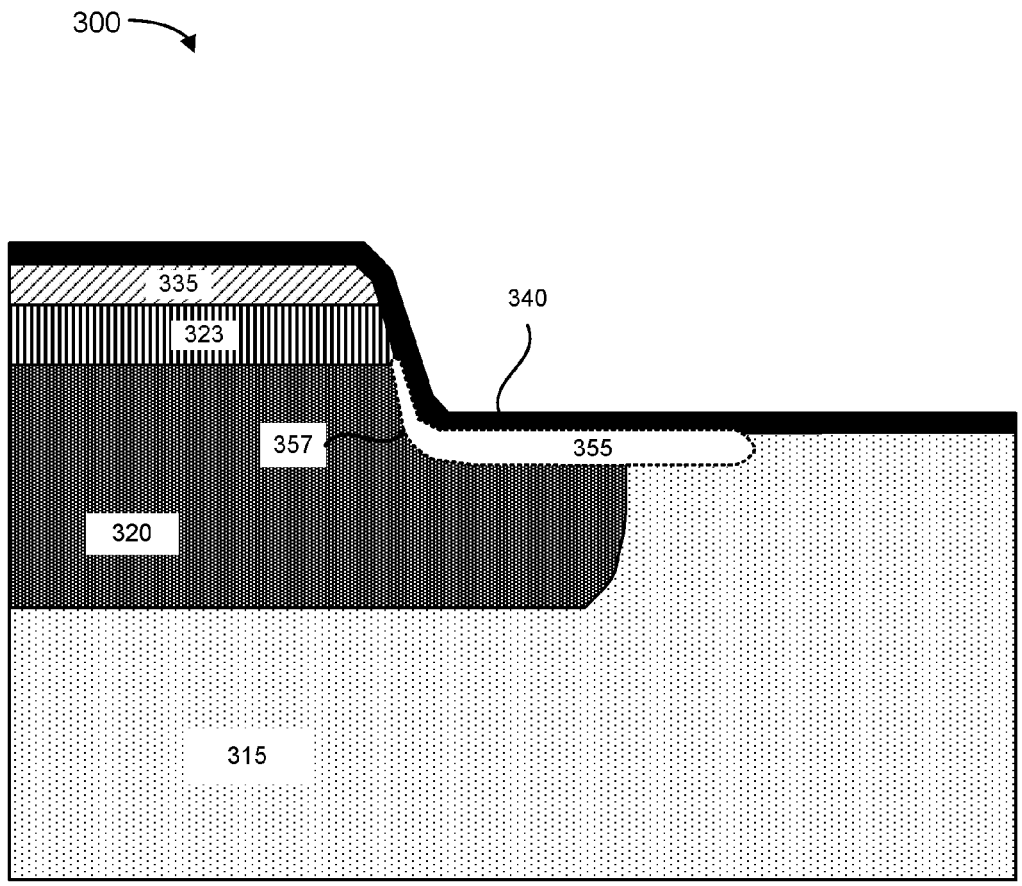
Figure 3F:
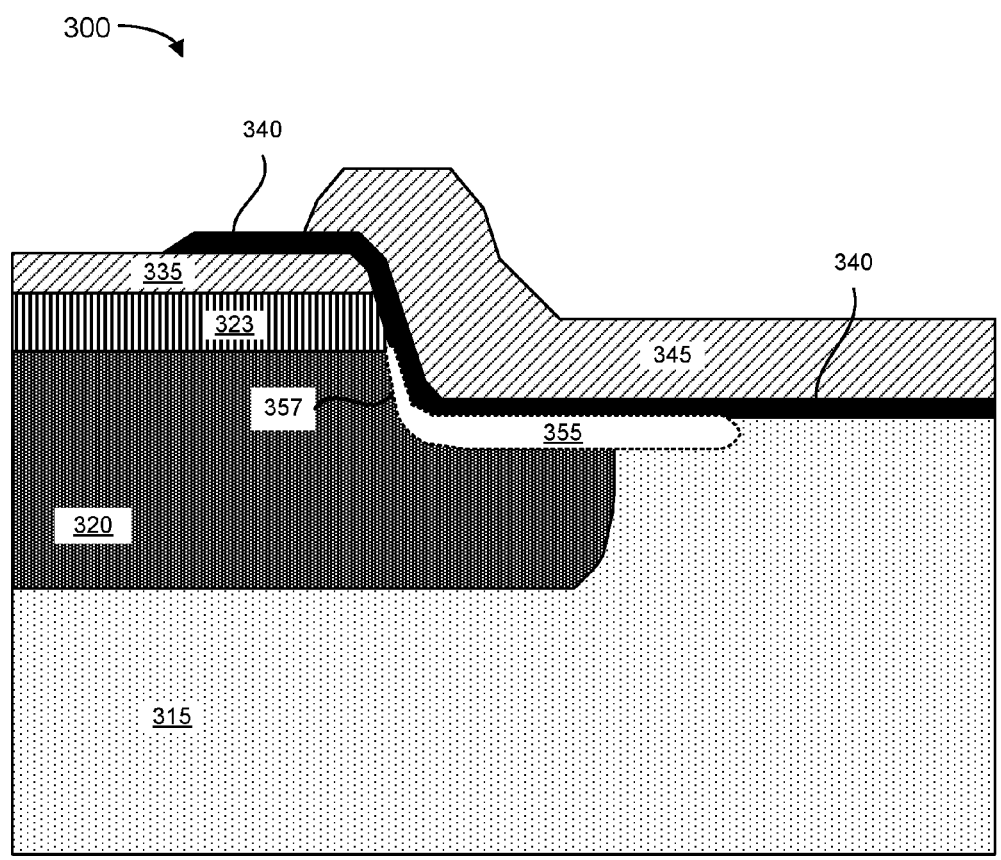

As illustrated in FIG. 3E, an oxide layer can be grown or deposited to form a gate dielectric 340. In an implementation, forming the gate dielectric 340 can include a performing an $N_2O$ or NO treatment, which can decrease a density of interface states. Such an $N_2O$ or NO treatment can activate the nitrogen donors implanted during the nitrogen implant 380 processing operation illustrated in FIG. 3D. As shown in FIG. 3F, a polysilicon gate electrode 345 can be formed on the gate dielectric 340. Other elements of the device 300 of FIG. 3F (e.g., elements of the devices 100 and 200 not shown in FIGS. 3A-3F) can be formed in other processing operations, such elements can include a p-type sub-contact region and a source and body ohmic contact. The device 300, as shown FIG. 3F, can also include a substrate and a drain contact (both not shown), such as in the devices 100, 200 and 400 of FIGS. 1, 2 and 4.

Figure 4:
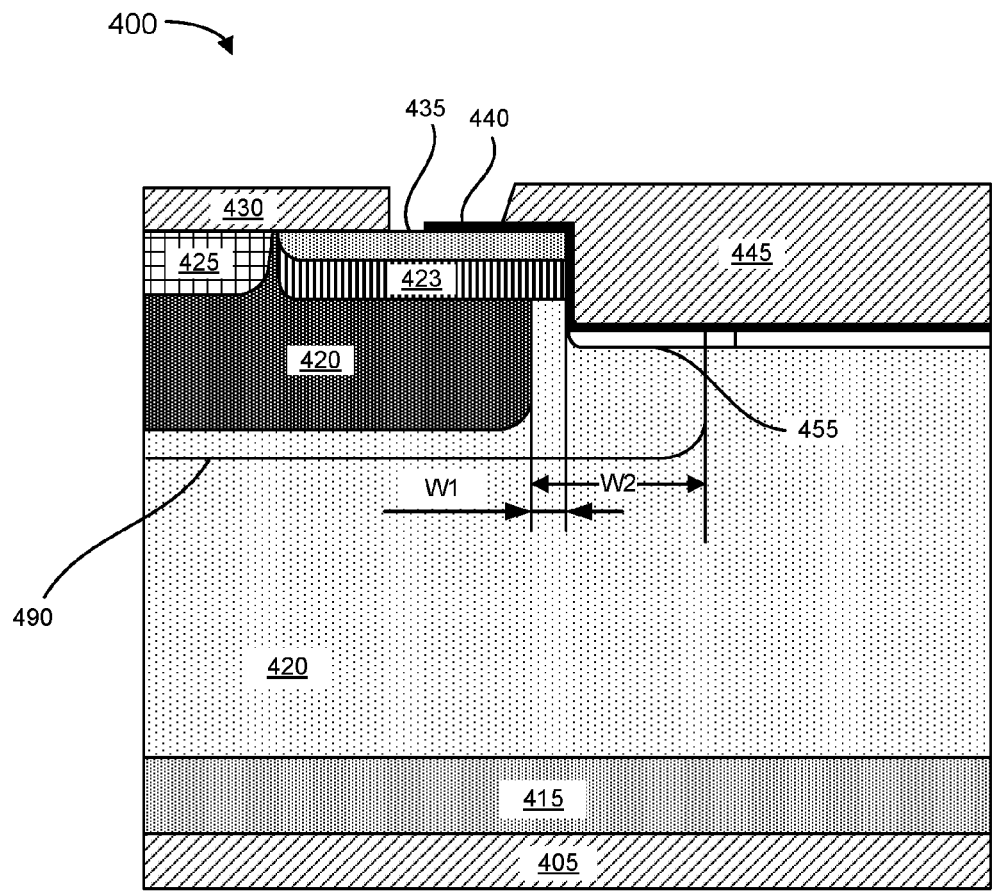
FIG. 4 is a cross-sectional diagram illustrating yet another SiC trench gate power MOSFET, according to an implementation.

FIG. 4 is a cross-sectional diagram illustrating yet another SiC trench gate power MOSFET device 400, according to an implementation. Briefly, as with the devices 100 and 200 illustrated in FIGS. 1 and 2, respectively, the device 400 shown in FIG. 4 can include a backside drain contact 405, a heavily doped n-type (n+) substrate 410, an n-type (e.g., lightly doped) drift region 415, a p-type body region 420, a sub-contact p-type implant 425 (for forming an ohmic contact), a source and body contact 430 (ohmic contact), an n-type (n+) source region 435, a gate dielectric 440 and a gate electrode 445. For brevity, as noted above, each of these elements may not be specifically discussed again with respect to the device 400 of FIG. 4.

As shown in FIG. 4, in this implementation, the shielding p-body region 420 is spaced from a vertical gate trench edge by a distance of W1. As also shown in FIG. 4, the distance W1 can be less than a width W2 of a zero-bias depletion width 490 disposed in the n-type drift region 415. In other implementations. W1 and W2 can be approximately equal. The width W2 can be determined in a number of ways. For example, the width W2 can be determined using Poisson's equation. Alternatively, the width W2 can be determined using voltage contrast analysis in a scanning electron microscope.

In the MOSFET device 400 shown in FIG. 4, device turn-on and turn-off can be controlled by applying a positive, or zero bias to the gate electrode 445. For example, a positive gate bias will invert the potential of a p-body 2 region 423 that is adjacent to the vertical trench sidewall, and an n-type electron inversion channel will be formed at the interface of SiC to the gate dielectric 440. In such an arrangement, the carrier mobility in the inversion channel along the vertical sidewall is high (such as previously discussed), and the effective length of the inversion channel can be made very short by decreasing the thickness of the p-body 2 region 423 (e.g., as described above) to a thickness between 50 nm and 500 nm (which can substantially define the effective channel length of the device 400). This arrangement can reduce the on-state resistance of the inversion channel (as compared to a device without a higher Vt region as defined by the p-body 2 region 423).

In the MOSFET device 400 of FIG. 4, high voltage blocking can be facilitated by using a deep p-body region 420, which can effectively shield the vertical MOS-channel. In order to achieve desired shielding, the shielding p-body region 420 and the trench sidewall can be formed at a very short lateral width W1, as shown in FIG. 4. As noted above, the width W1 can be smaller than (or approximately equal to) the width W2 of the zero-bias depletion region 490 of the MOSFET device 400. An implanted, n-doped lateral channel portion 455 can also be formed beneath the surface of the lateral MOS-channel region, such using the approaches described herein. An n-implant in the lateral MOS-channel portion 455 can decrease a threshold voltage for the lateral portion 455 to a low number (e.g., zero volts), or can make the threshold voltage for the lateral portion 455 a negative number, e.g., make the lateral MOS-channel portion (region) 455 normally ON. Such an approach can increase the carrier mobility in the lateral channel portion 455, and, as a result, reduce the MOSFET device 400's on-state resistance (Rdson). The n-implant used to define the lateral portion 455 can also eliminate or reduce any increase of the lateral MOS-channel resistance due to proximity of the lateral channel portion 455 to the deep p-body 420.

In other implementations, device performance of SiC trench gate MOSFETs can be improved by reducing gate capacitance and by improving reliability of the associated gate dielectrics. Such gate capacitance reductions and reliability improvements can be achieved by combining threshold voltage control in a lateral MOS-channel portion (such as in the implementations described above) in combination with formation of a thicker gate dielectric (gate oxide) on the lateral channel portion of such SiC trench gate MOSFETs. For instance, threshold voltage techniques, such as those described herein, can be implemented to cause a lateral MOS-channel portion to be normally on (conducting). This threshold control can be achieved by increasing a dose of the implanted donors while forming a lateral MOS-channel portion (such as the lateral MOS-channel portions 155, 255, 355 and 455 discussed above) to make the respective lateral channel regions normally on (e.g., conductive even when no positive gate bias is applied to a corresponding gate electrode). FIGS. 5A-8E illustrate example implementations of such devices and associated semiconductor processing operations that can be used to produce those devices.

Briefly, in such implementations, a gate dielectric (gate oxide) thickness over (on) a lateral channel region (e.g., channel regions 155, 255, 355 and 455) can be fabricated (using approaches such as those described below) to be at least 2 times thicker than a thickness of a gate dielectric (gate oxide) disposed on vertical, or inclined (e.g., sidewall) channel region portions of respective SiC trench gate MOSFET devices. In other implementations, a ratio (Rox) of lateral gate dielectric thickness to vertical (or inclined) gate dielectric thickness can be greater than or equal to 3, such that gate capacitance is further reduced.

In certain implementations, Rox can be between 6 and 20. However, achieving such higher Rox (e.g., between 6 and 20) can complicate associated semiconductor device processes due, at least, to difficulty in achieving a link between vertical channel or inclined channel (sidewall channel) portions and a corresponding lateral channel portion without increasing parasitic resistance in a region of the MOSFET channel that links the vertical (inclined) channel portions and the corresponding lateral channel portion.

FIGS. 5A-5I are cross-sectional diagrams illustrating semiconductor processing operations for producing a SiC trench gate MOSFET device and a corresponding SiC trench gate MOSFET device 500 (e.g., a unit cell), according to an implementation. The structure of the device 500 is shown, by way of example, in FIG. 5I It will be appreciated that a semiconductor process flow (including the operations illustrated in FIGS. 5A-5I) for producing the device 500 can have a number of similarities with the other semiconductor processing flows described herein for producing other SiC trench gate MOSFET devices.

Figure 5A:
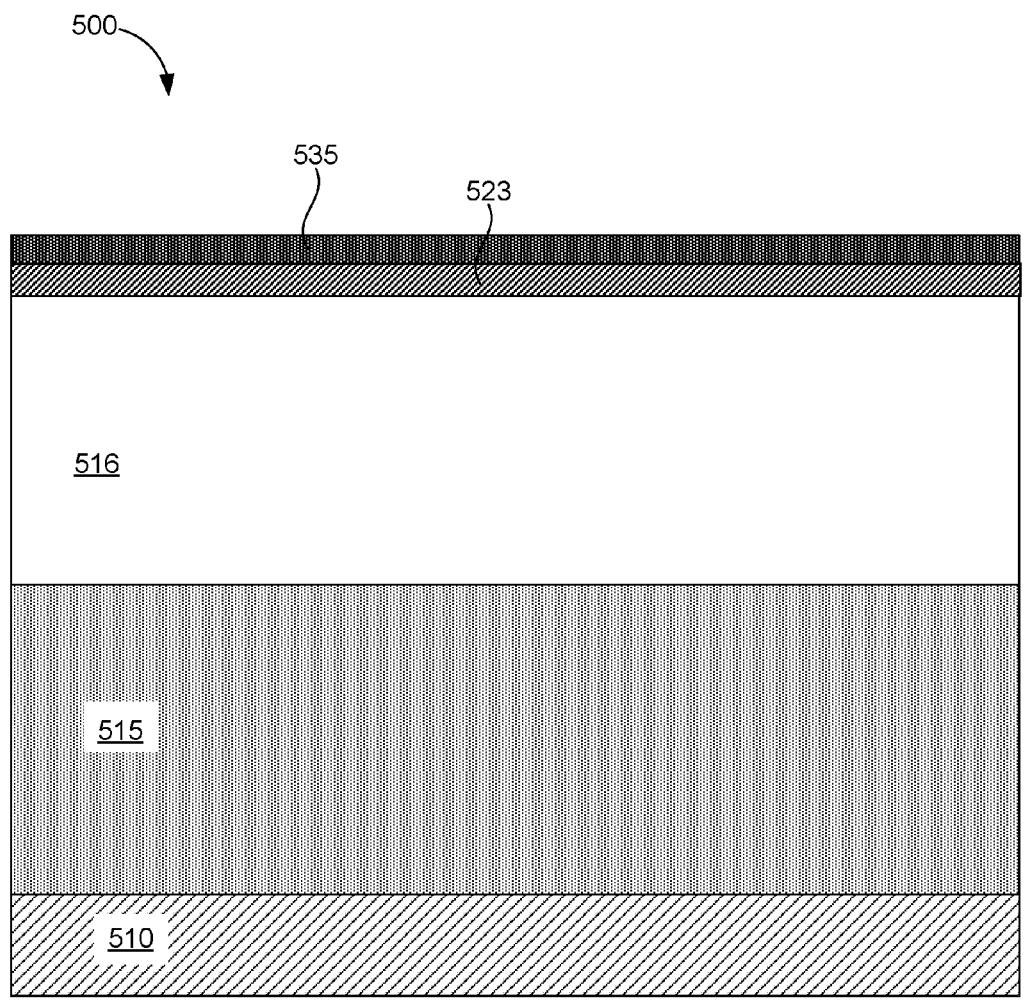
FIGS. 5A-5I are cross-sectional diagrams illustrating semiconductor processing operations for producing a SiC trench gate MOSFET device and a corresponding SiC trench gate MOSFET device, according to an implementation.

FIG. 5A illustrates an epitaxial structure (substrate) that can be used for producing (fabricating) the device 500. In this implementation, the device 500 can be formed on a carbon face of a heavily doped (e.g., n+ or n++) silicon carbide (4H SiC) substrate 510. As shown in FIG. 5A, a lightly-doped (e.g., n−) epitaxial layer 515 (epi-layer 515) can be formed (disposed) on a slightly off-oriented carbon crystal face (e.g., a 000-1 face) of the substrate 510. In an implementation, an off-orientation angle for 4H SiC can be 4 degrees. However, in certain implementations, depending on the semiconductor device manufacturing process, a high-quality epitaxial layer (e.g. the epi-layer 515) can be achieved for off-orientation angles between approximately 1 degree and 8 degrees.

The epi-layer 515 can be used as (implement, act as, etc.) a drift region of the device 500. Accordingly, the epi-layer 515 may be interchangeably referred to as the drift region 515 in the following discussion. A doping concentration and a thickness of the epi-layer 515 can be selected to achieve a desired on-state resistance corresponding with a desired blocking voltage for the device 500. For example, to achieve a blocking voltage of around 1200 Volts (V), the drift region (epi-layer) can have a thickness of approximately 10 microns with a doping concentration (e.g., n-type doping concentration) of approximately $1 \times 10^{16}$ cm$^{-3}$.

As shown in FIG. 5A, a JFET channel region (JFET layer, JFET region) 516 can be formed (disposed) on the drift region (epi-layer) 515. The JFET layer 516 can have a doping concentration (e.g., n-type doping concentration) that is between approximately 1.3 times and 10 times the doping concentration of the drift region 515. A thickness of the JFET layer 516 can be between approximately 1 micron and 3 microns.

Depending on the particular implementation, the JFET layer 516 can be formed epitaxially or using high-voltage implantation of donor ions of nitrogen and/or phosphorus. Formation of the JFET layer 516 can be sequentially followed by formation of a p-type channel stopper layer (channel stopper layer, channel stopper) 523 and by formation of a heavily n-type doped source-region layer (source layer, source region) 535. A doping concentration of the channel stopper layer 523 can be between approximately $5 \times 10^{16}$ cm$^{-3}$ and $1 \times 10^{18}$ cm$^{-3}$. Further, the channel stopper layer 523 can have a thickness that is between approximately 100 nm and 1000 nm. In some implementations, the channel stopper layer 524 and the source layer 535 can be doped during epitaxial growth of those layers. In other implementations, ion implantation can be used to dope the channel stopper 523 and the source 535, or can be combined with doping during epitaxial growth (e.g., perform ion implantation after epitaxial growth).

Figure 5B:
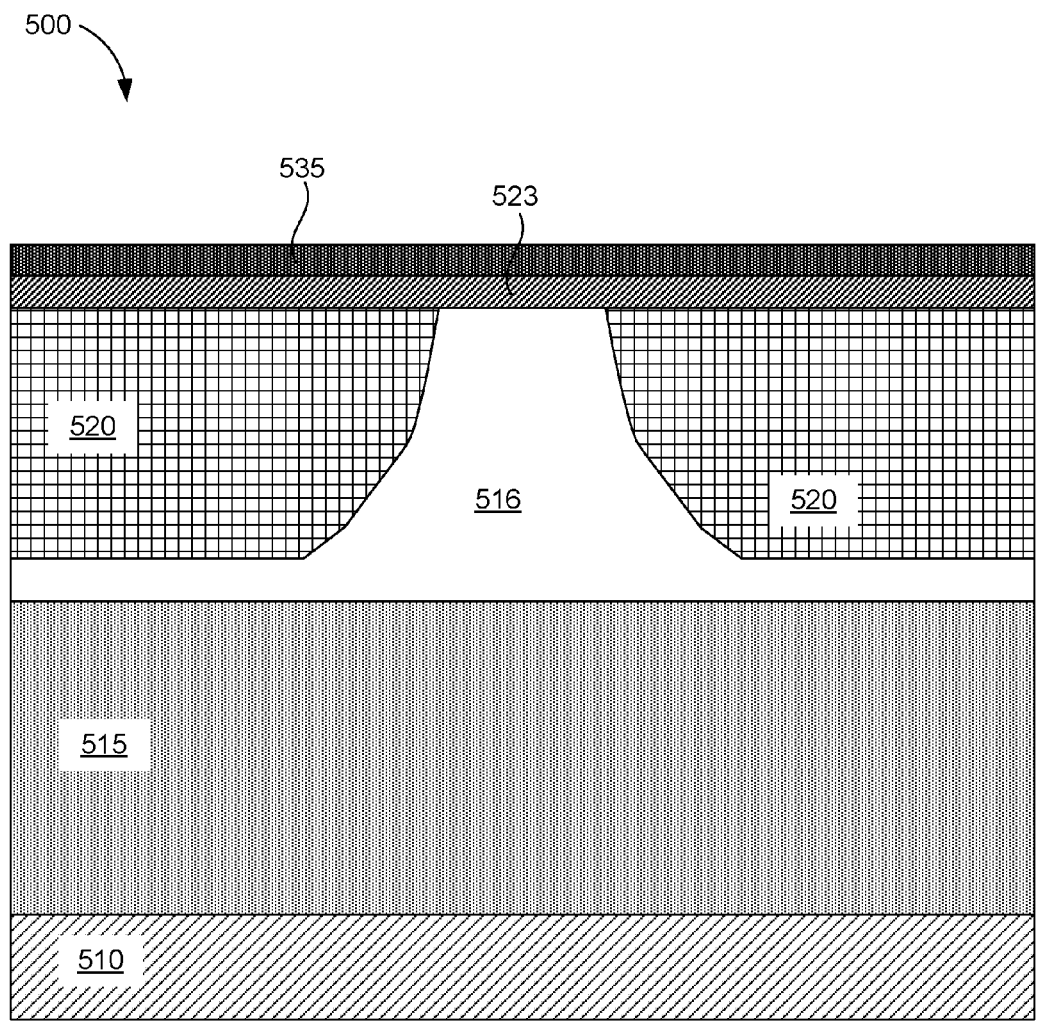

As shown in FIG. 5B, deep ion implantation of acceptor dopants, such as Al or Ga, can be performed to form (define) shielding p-bodies 520. For example, a process such as the process discussed with respect to FIG. 3B can be used to form the shielding p-bodies 520. Such deep ion implants can have implanted ion profiles that have a peak that is deep in the bulk of a corresponding device and also have a low doping concentration region that in regions near a surface (an upper surface) of the device (substrate, epitaxial structure). Such doping profiles are achieved because a majority of high-energy ions (during implantation) pass through the near-surface regions (and into the bulk). This type of ion implantation profile can be beneficial for the performance of the MOSFET 500, because a threshold voltage of this device can then be determined by the doping concentration of the channel stopper layer 523 rather than by the doping concentration of the shielding p-bodies 520. Accordingly, in such implementations, a p-doping concentration of the shielding p-bodies 520 near their interface with the channel stopper layer 523 can be at least 2 times lower than a doping concentration of the channel stopper layer 523.

In some implementations, ion channeling can be used when forming the shielding p-bodies 520 to achieve deep implants without use of excessively high ion implant energies (which can be undesirable in manufacturing processes due, at least, the associated processing costs). Such a channeled implant can be performed by implanting a SiC substrate (such as the substrate shown in FIGS. 5A and 5B) at a small off-orientation angle so as to align the ion implantation beam parallel (substantially parallel) to a principal hexagonal axis of the 4H SiC crystal structure. As a result of this beam alignment, implanted ions are channeled along SiC crystal planes, which can significantly increase ion penetration for a same energy of implanted ions for a non-channeled implant. Such channeled implants can be performed without heating a substrate being implanted, because the ion channeling effect can be suppressed with increasing temperature due to resulting increases in crystal lattice vibrations. In example implementations, such channeled implants can be performed prior to a high-dose implant of subcontact p-type pockets (subcontact pockets, subcontact layer) 524 (shown in FIG. 5C and discussed further below), because such high dose implants can result in accumulated lattice damage, which damage can partially, or fully suppress the channeling effect.

Figure 5C:
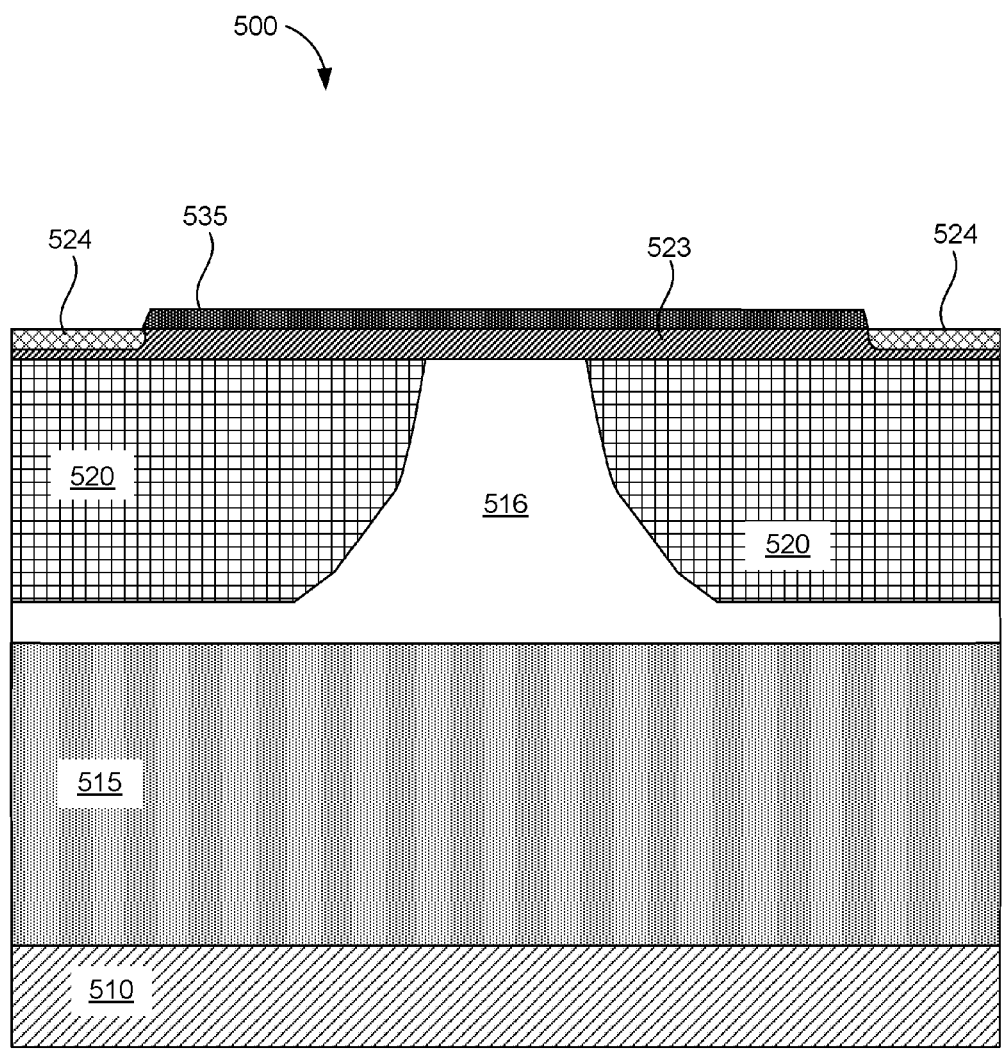

As shown in FIG. 5C, heavily doped subcontact p-type pockets (subcontact pockets) 524 can then be formed (defined) in the channel stopper layer 523 using ion implantation. As also shown in FIG. 5C, portions of the heavily n-doped source region 535 can be etched away in the area of the subcontact pockets 524 prior to implantation (e.g., using a reactive ion etch (RIE) and a mask of silicon dioxide or silicon nitride to define the areas of the source region 535 that are to be removed and/or the areas to be implanted to form the subcontact pockets 524). Acceptor doping concentration in the subcontact pockets 524 can be approximately $1 \times 10^{20}$ cm$^{-3}$, which can reduce Ohmic contact resistance for contacts with the shielding p-bodies 520. Ion implantation of the subcontact pockets 524 can be performed at an elevated temperature between approximately 300° C. and 600° C. Ion implantation of the subcontact pockets 524 can be followed by stripping off an implantation mask, such as the mask discussed above. While not specifically shown, implantation of a junction termination region can be performed at this point of a corresponding semiconductor process flow. However, for purposes of clarity and illustration, formation of the junction termination region is not shown in FIGS. 5A through 5I, as those figures only illustrate formation of a unit cell for a corresponding SiC trench gate MOSFET device.

After implantation of the subcontact pockets 524 (and implantation of a junction termination region), the SiC surface (upper surface) of the structure in FIG. 5C can be cleaned by depositing a carbon coating on the upper surface. A high-temperature anneal can then performed at a temperature between approximately 1550° C. and 1750° C., and the carbon coating can then be stripped off. The upper surface, and a SiC wafer as a whole, may be additionally cleaned by annealing the wafer (device, substrate, etc.) in an oxygen ambient with a subsequent hydrofluoric (HF) acid dip.

Figure 5D:
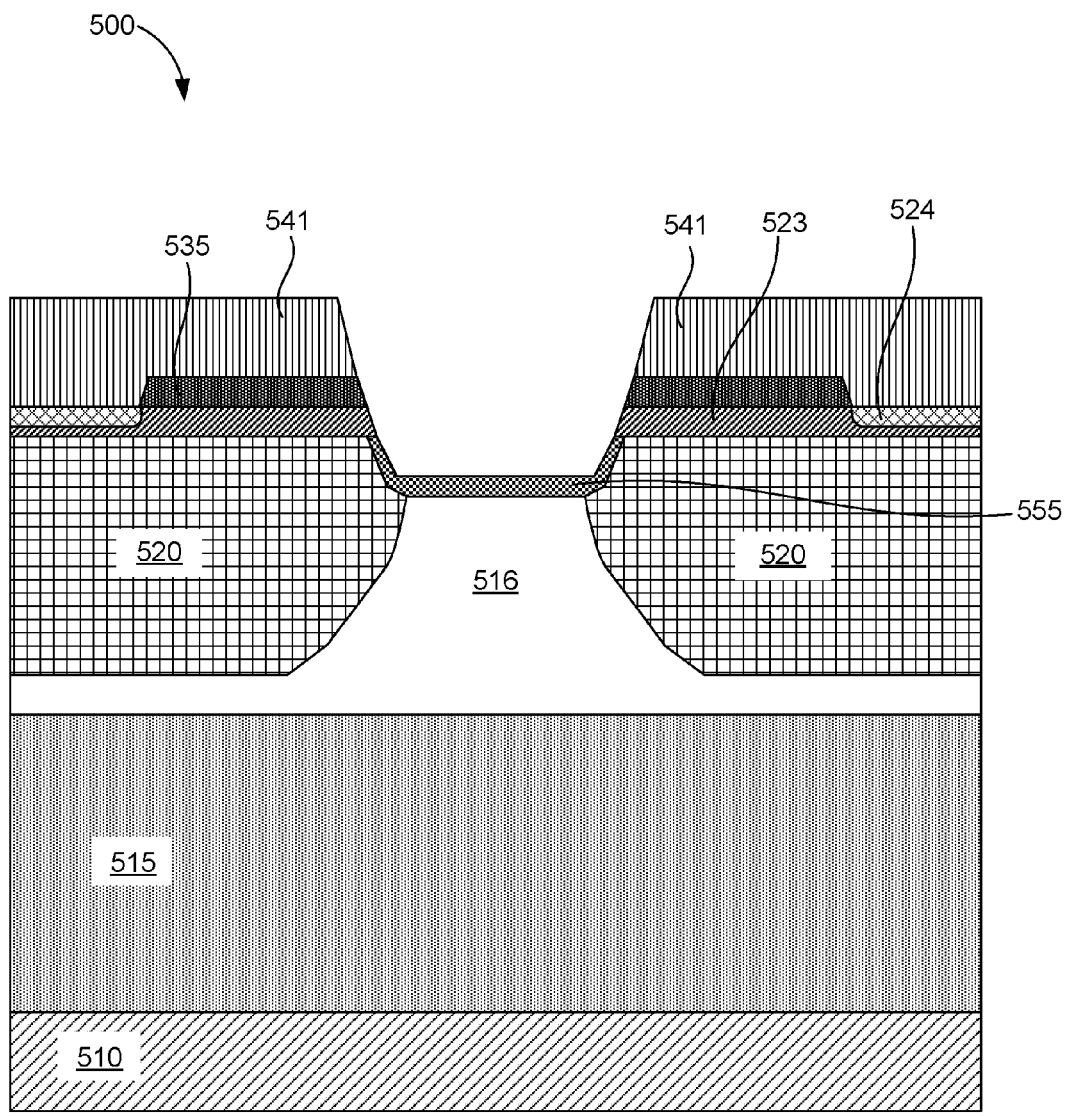

As shown in FIG. 5D, a layer of silicon dioxide 541 approximately 1 micron thick can then be deposited and patterned for use in forming a trench (in the silicon dioxide 541) with sloping (inclined) sidewalls, such as shown in FIG. 5D. The patterned silicon dioxide 541 can then be used as a mask for plasma etching of SiC to form a gate trench for the device 500. Using a low etch selectivity recipe (e.g., having similar etch rates for SiC and $SiO_2$), the slope (incline) of the sidewalls of the silicon dioxide 541 can be extended into the SiC (e.g., through the source layer 535, the channel stopper layer 523 and into the JFET layer 516, as shown in FIG. 5D. For example, the low selectivity etch could be an inductively-coupled plasma etch (of SiC and SiO2) using a mixture of sulfur hexafluoride ($SF_6$ and of argon (Ar).

In an implementation, the trench etch can be stopped after etching a few hundred nanometers below the channel-stop p-type layer, such as shown in FIG. 5D. Nitrogen implantation can then be performed to form (define) a built-in channel layer 555 with both a lateral portion and inclined portions (or vertical sidewall portions in other implementations). The implant for the built in channel layer can have a nitrogen dose of between approximately $1 \times 10^{11}$ $cm^{-2}$ and $1 \times 10^{13}$ $Cm^{-2}$ for the lateral channel portion, which can be selected based on desired threshold control in the lateral portion of the built-in channel layer 555, such as described herein. A nitrogen dose of the inclined portions of the built-in channel layer 555, in this example, will have a lower value than the lateral channel portion (e.g., resulting in the inclined channel portions being normally off and having a higher threshold voltage than the lateral channel portion).

Figure 5E:
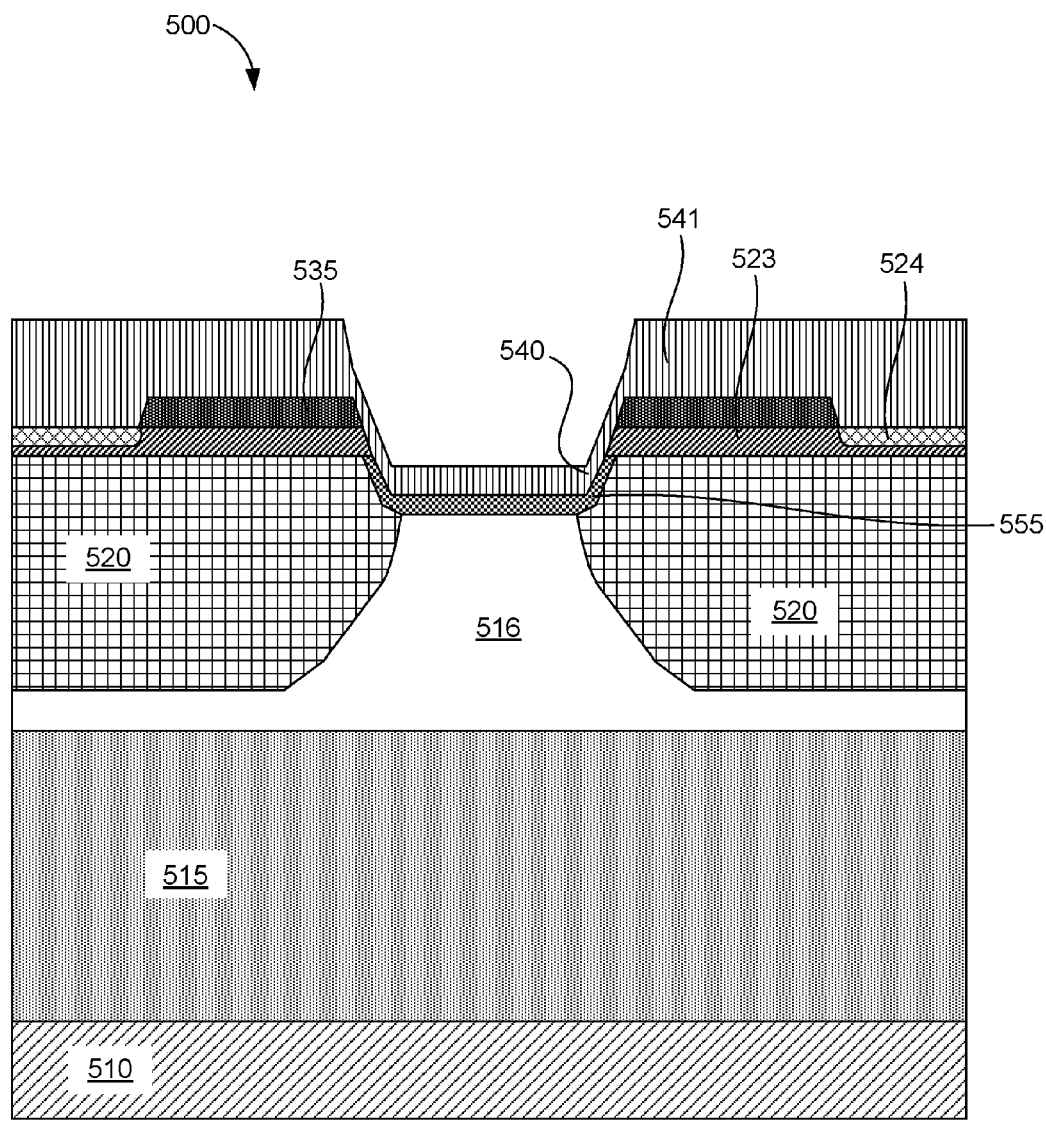

As shown in FIG. 5E, oxidation of SiC can then be performed to form a gate dielectric (gate oxide) 540 of the device 500. Because, as discussed above, the formation of the device 500, in this example, is on a carbon face of 4H SiC, oxidation of SiC will occur more rapidly on the lateral portion of the built in channel 555 than on the inclined portions of the built in channel. Accordingly, a Rox value of greater than or equal to 2 can be achieved for the gate dielectric 540. Oxidation to form the gate dielectric 540 can be followed by a post-oxidation anneal at a temperature between approximately 1150° C. and 1350° C. The post-oxidation anneal can be performed in an ambient containing NO or $N_2O$. The post-oxidation anneal can form a nitrogen-rich layer at the interface of SiC to SiO2, which can be beneficial for forming a low-defect interface. The anneal temperature between 1150° C. and 1350° C. is sufficient for activation of a low-dose nitrogen implant of, such as the implant used to form the built-in channel layer 555. It will appreciated that the sequence of semiconductor processing operations described with respect to FIGS. 5A-5I (as well as the other embodiments described herein) are given by way of example. In other implementations, other sequences of operations are possible. For example, when forming the device 500, the gate trench can be formed and the built-in channel 555 can be implanted prior to performing the high-temperature anneal at 1550° C. to 1750° C. for cleaning the upper surface, such as was discussed with respect to FIG. 5C.

Figure 5F:
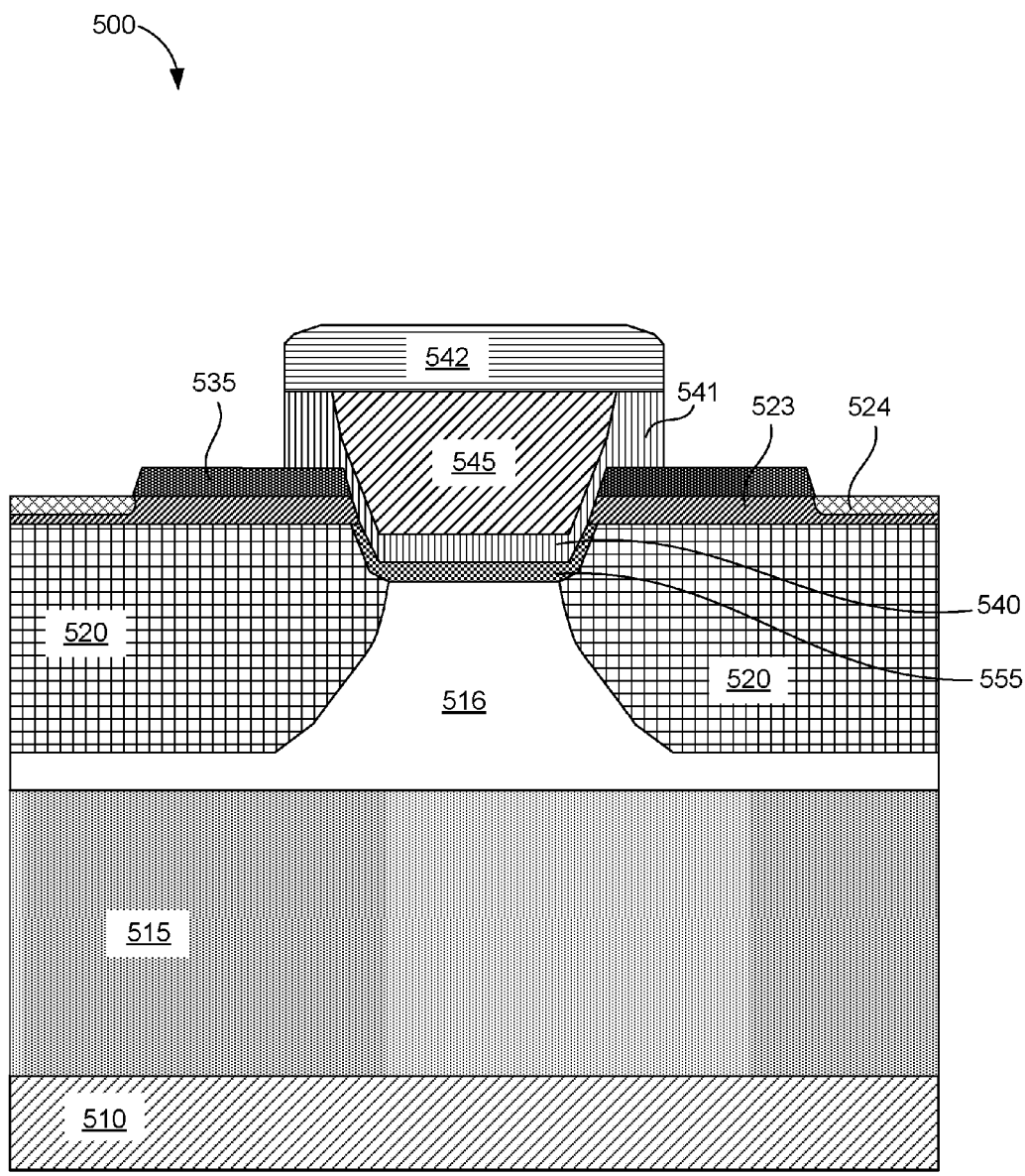
Figure 5G:
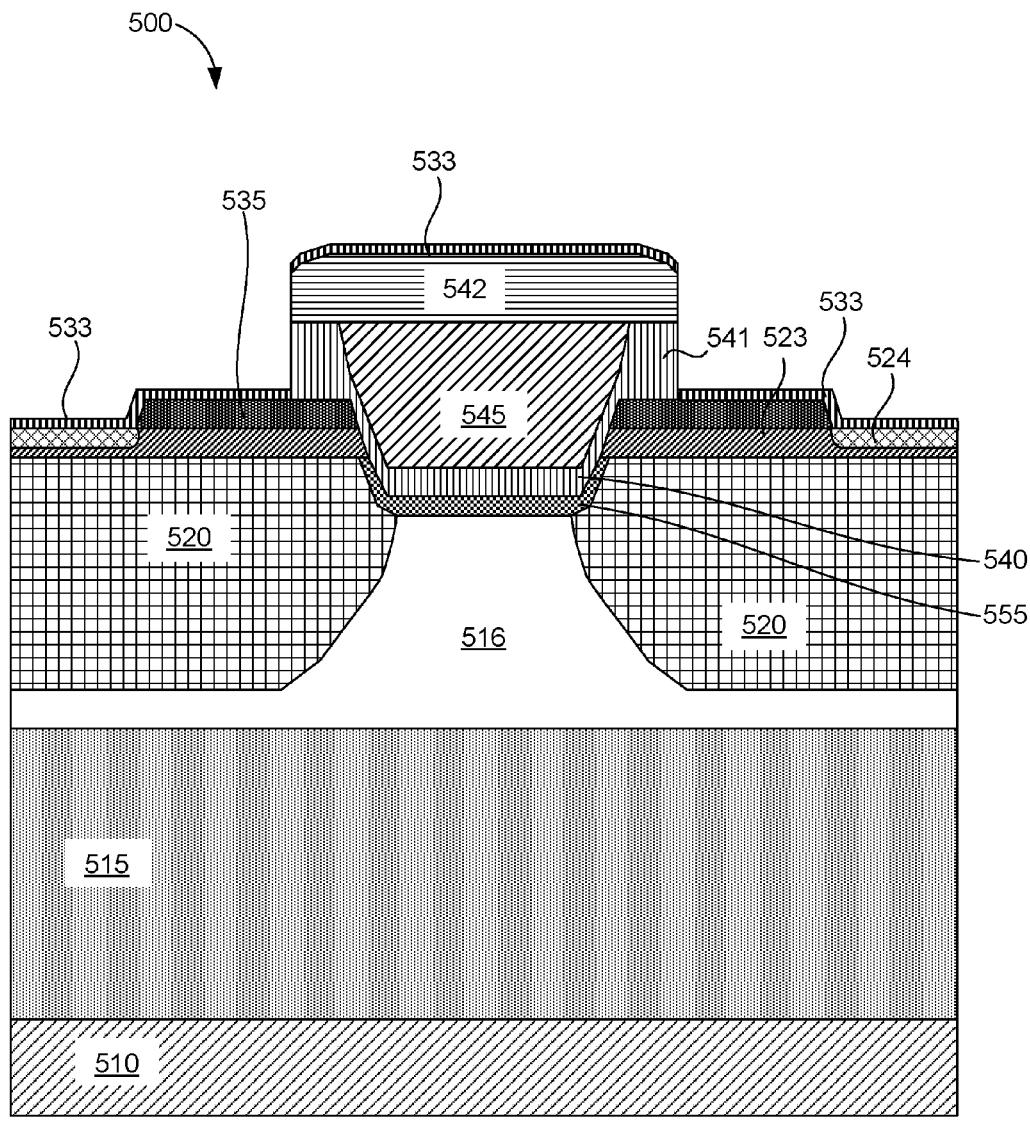

As shown in FIG. 5F, further processing of the device 500 can include deposition and pattering of a polysilicon gate 545, patterning of the dielectric layer 541, as well as deposition and patterning of an interlayer dielectric 542. Also, Ohmic contacts to the source regions 535 and to the shielding p-bodies 520 can be formed. For instance, the Ohmic contacts can be formed by performing a self-aligned silicide process, which can also be referred to as a salicide process. To form the Ohmic contacts using a salicide process, a layer of nickel 533 can be deposited on an upper surface of a wafer, such as shown in FIG. 5G. An anneal process can then be performed, which causes the nickel layer 533 to react with SiC (e.g., exposed through openings in the dielectric layer 541) to form the silicide layer 530 shown in FIG. 5H. Typical anneal temperatures for nickel-based salicide processing can be 650° C.-800° C. As also shown in FIG. 5H, non-reacted nickel 533, e.g., on top of interlayer dielectric 542 (e.g., silicon dioxide) can be removed chemically, e.g., using a phosphoric etch for nickel Such an etch is selective and will not remove (will only remove a negligible amount of) reacted nickel silicide.

Figure 5H:
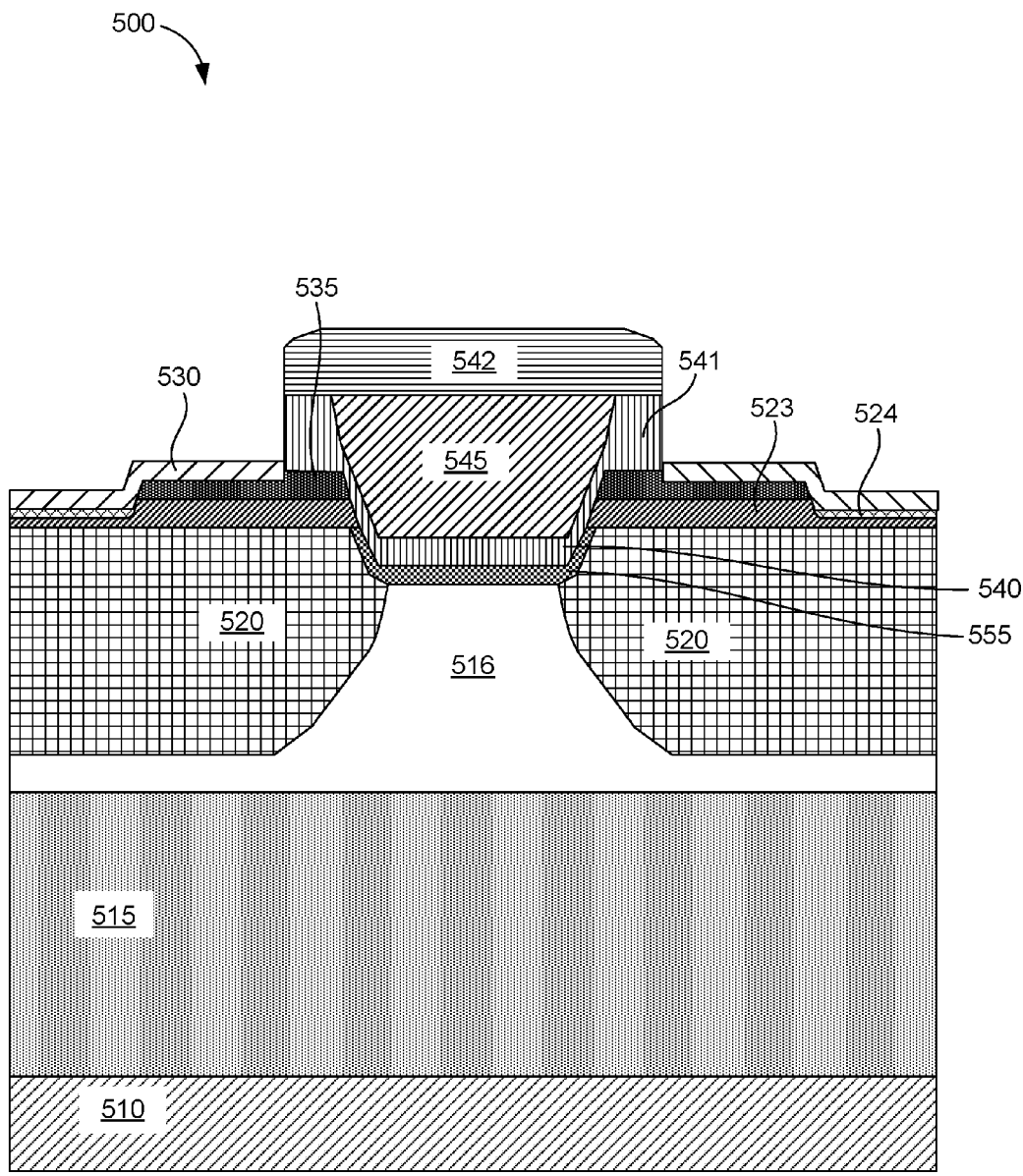
Figure 5I:
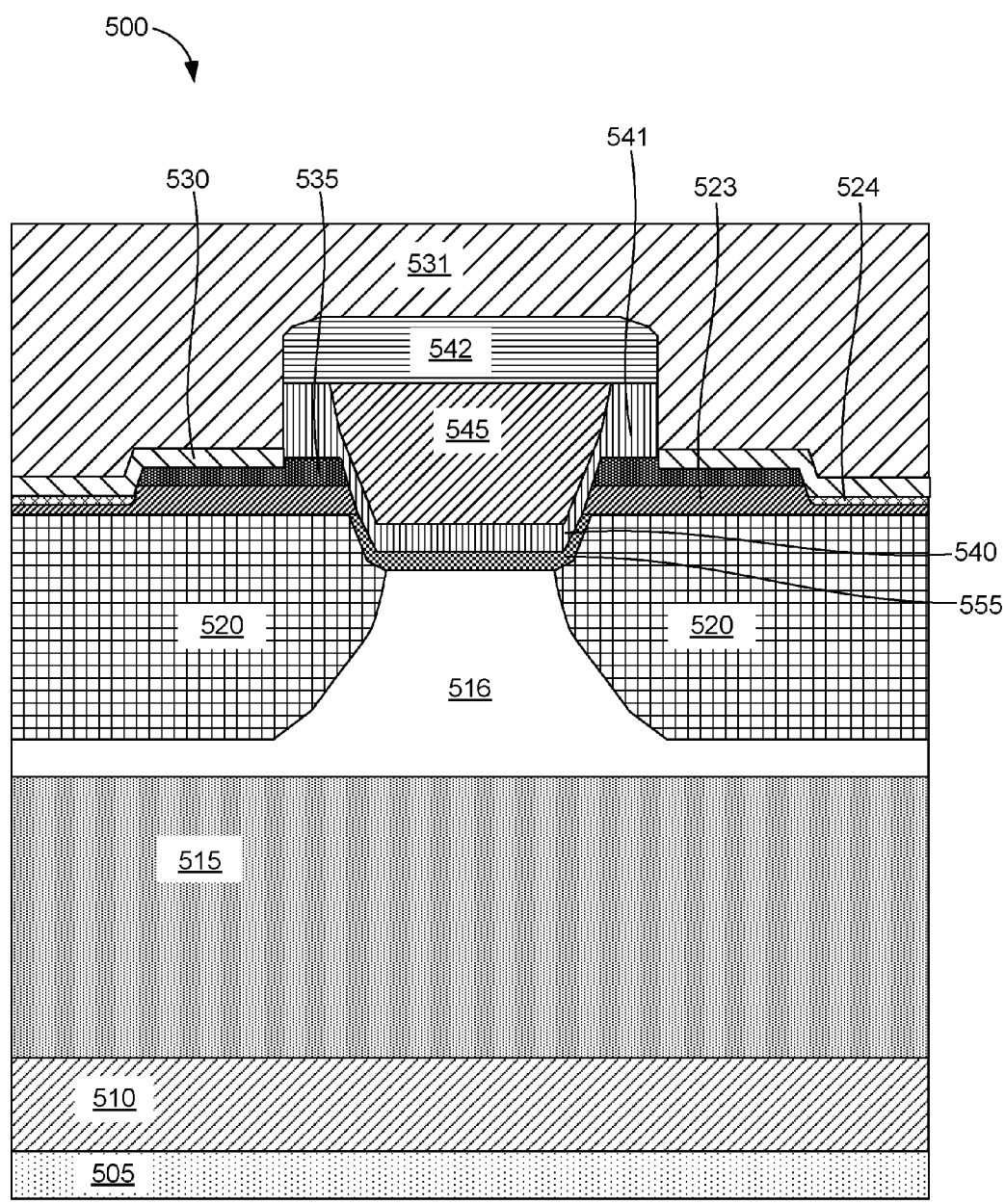

After formation of Ohmic contacts, as discussed with respect to FIGS. 5G and 5H, a pad metal layer 531 can be deposited and patterned, such as shown in FIG. 5I The pad metal (which can form an electrical contact to the source regions 535 and the shielding p-bodies 520) can be a stack of titanium nitride (TiN) and aluminum (Al). TiN can be used to form a diffusion barrier between nickel silicide and Al. A completed unit cell of the SiC trench gate MOSFET 500 produced using the foregoing described process is shown in FIG. 5I.

The device 500 of FIG. 5I can turn on in response to a positive bias applied at the gate electrode 545. In an example implementation, the device 500 can achieve a full on-state condition at a bias on the gate electrode 545 of between 15 V and 20 V. As a result, a low-resistance inversion channel can be formed (at this gate bias) at the interface of the channel stop layer 523 and the gate dielectric 540 (e.g., the portions of the gate dielectric 540 that are in contact with the channel stopper layer 523). A vertical (e.g., as in the device 600) or inclined (e.g., as in the device 500) orientation of this interface can improve electron mobility and reduce an associated on-state channel resistance. Also, the inversion channel can have a normally off behavior. That is no inversion channel is formed at a zero volt gate bias, or at a positive gate bias of that is less than the threshold voltage (e.g., between approximately 2 V and 5 V). In such implementations, the threshold voltage can be controlled by an acceptor concentration in the channel stop layer 523. The vertical (inclined) portions of the built-in channel 555 can be either normally on or normally off (e.g., at a zero volt gate bias). The lateral portion of the built-in channel 555 can be designed to be normally on, because the gate oxide over this region may be too thick to allow efficient control of channel conductivity based on a potential of the gate electrode. An electron current can flow through the non-depleted portion of the JFET region 516, through the drift region 515 to the drain region, which is implemented, at least in part, by the n+ substrate 510. The thickness of the substrate (drain) region 510 and an associated drain contact layer 505 in FIG. 5 may not be shown to scale. In this example, and in other examples, these regions are intentionally compressed, so as to allow more detailed illustration of the other features of the device 500.

Under off-state conditions the built-in channel 555 of the device 500 is depleted. Therefore, the charge of donors in the built-in channel 555 contributes to an electric field over the oxide. Accordingly, excessive doping (high doping concentrations) of the built-in channel may be undesirable.

Under high-voltage off-state conditions, the gate dielectric (gate oxide) 541 can also be exposed to a large electric field due to high positive potential in the drain region. This potential can be effectively shielded by the shielding p-bodies 520. The shielding efficiency of the p-bodies 520 can be increased by decreasing their lateral spacing with respect to each other. However, too narrow of a spacing can result in additional on-state series resistance of the device 500 in the JFET region 516. To compensate for such resistance increases, the doping concentration in the JFET region 516 can be increased (e.g., as compared to the drift region 515), where such a doping concentration increase can mitigate (reduce) an undesirable increase of the JFET region 516 resistance due to decreased later spacing between the shielding p-bodies 520).

Further, in certain implementations, a transition of donor doping level from the drift region 515 to the JFET region 516 need not be stepwise. For instance, a graded transition of the doping levels between drift region 515 and the JFET region 516 can be used, which can reduce a total on-state resistance for the device 500.

Figure 6A:
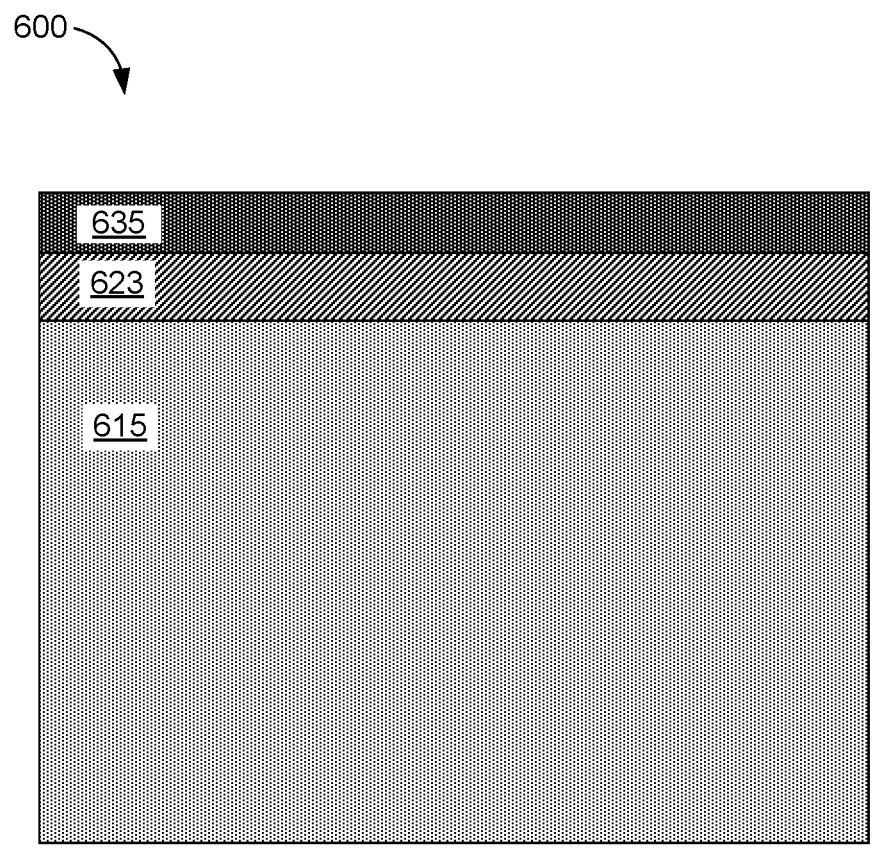
FIGS. 6A-6J are cross-sectional diagrams illustrating semiconductor processing operations for producing a SiC trench gate MOSFET device and a corresponding SiC trench gate MOSFET device, according to an implementation.
Figure 6B:
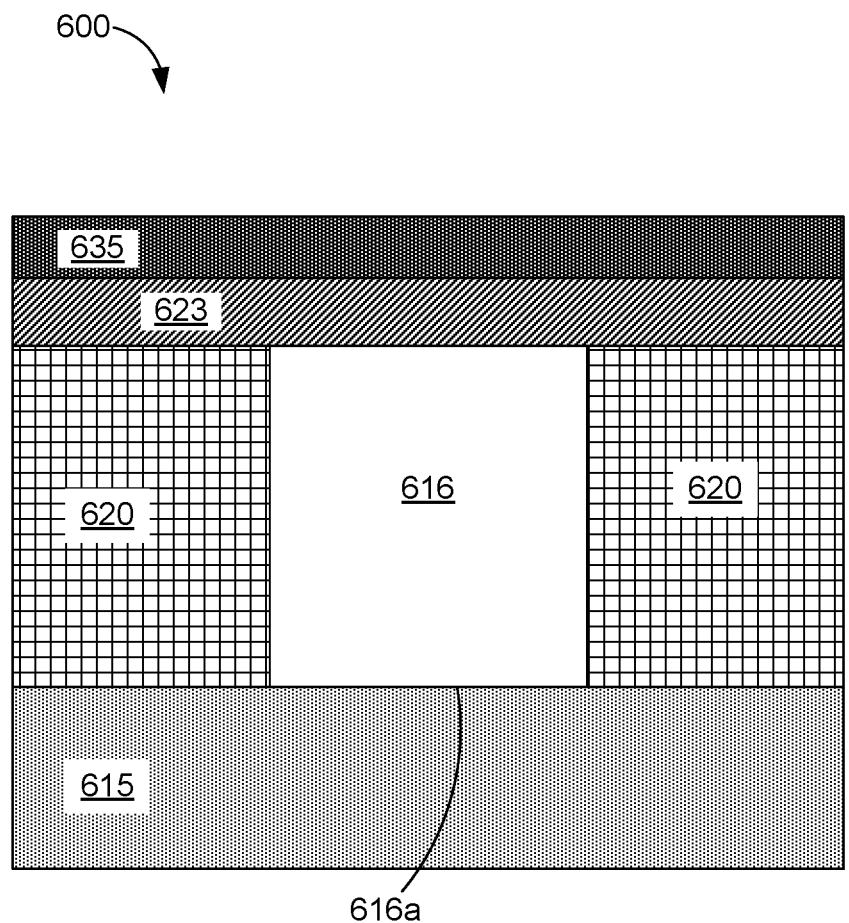
Figure 6C:
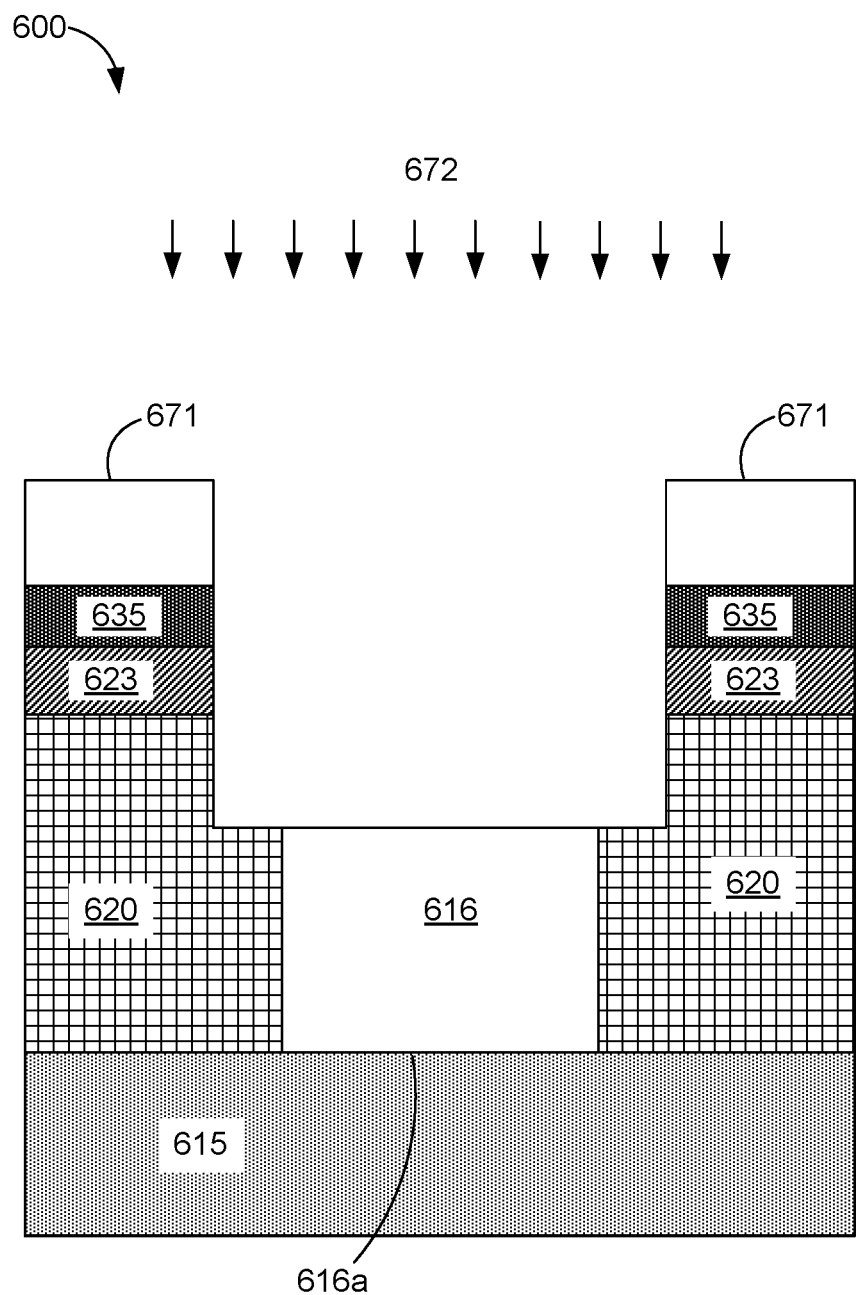
Figure 6D:
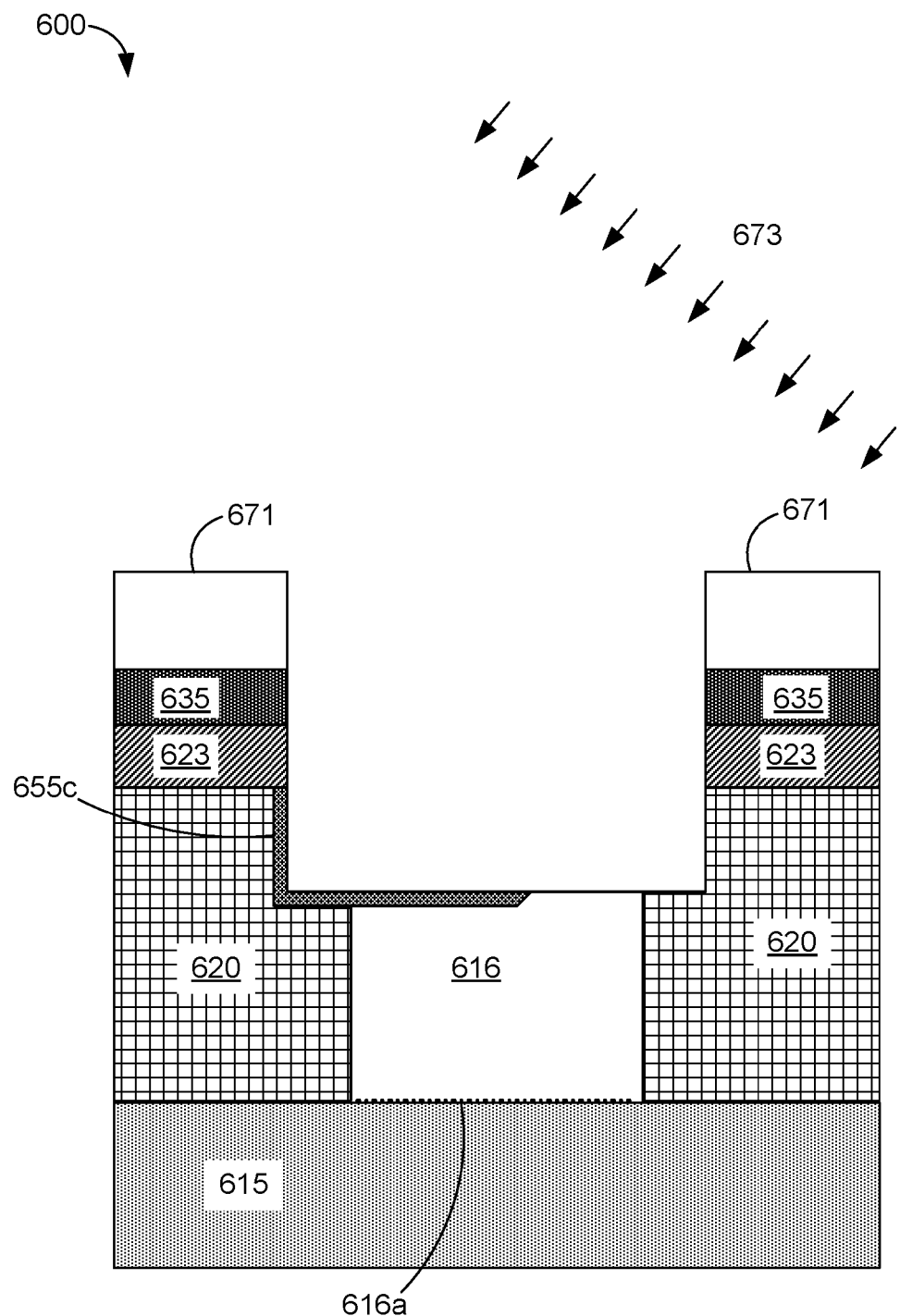
Figure 6E:
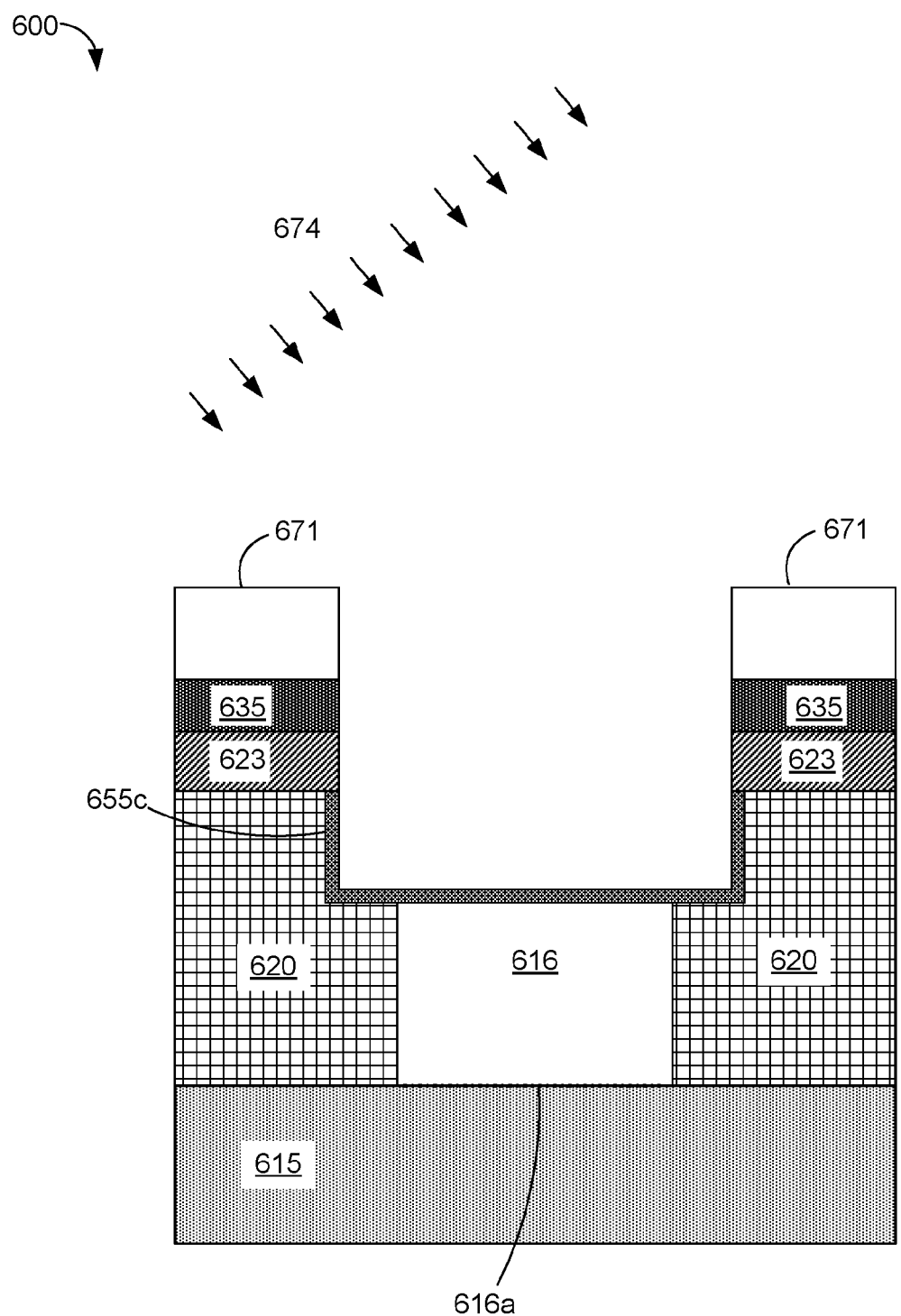
Figure 6F:
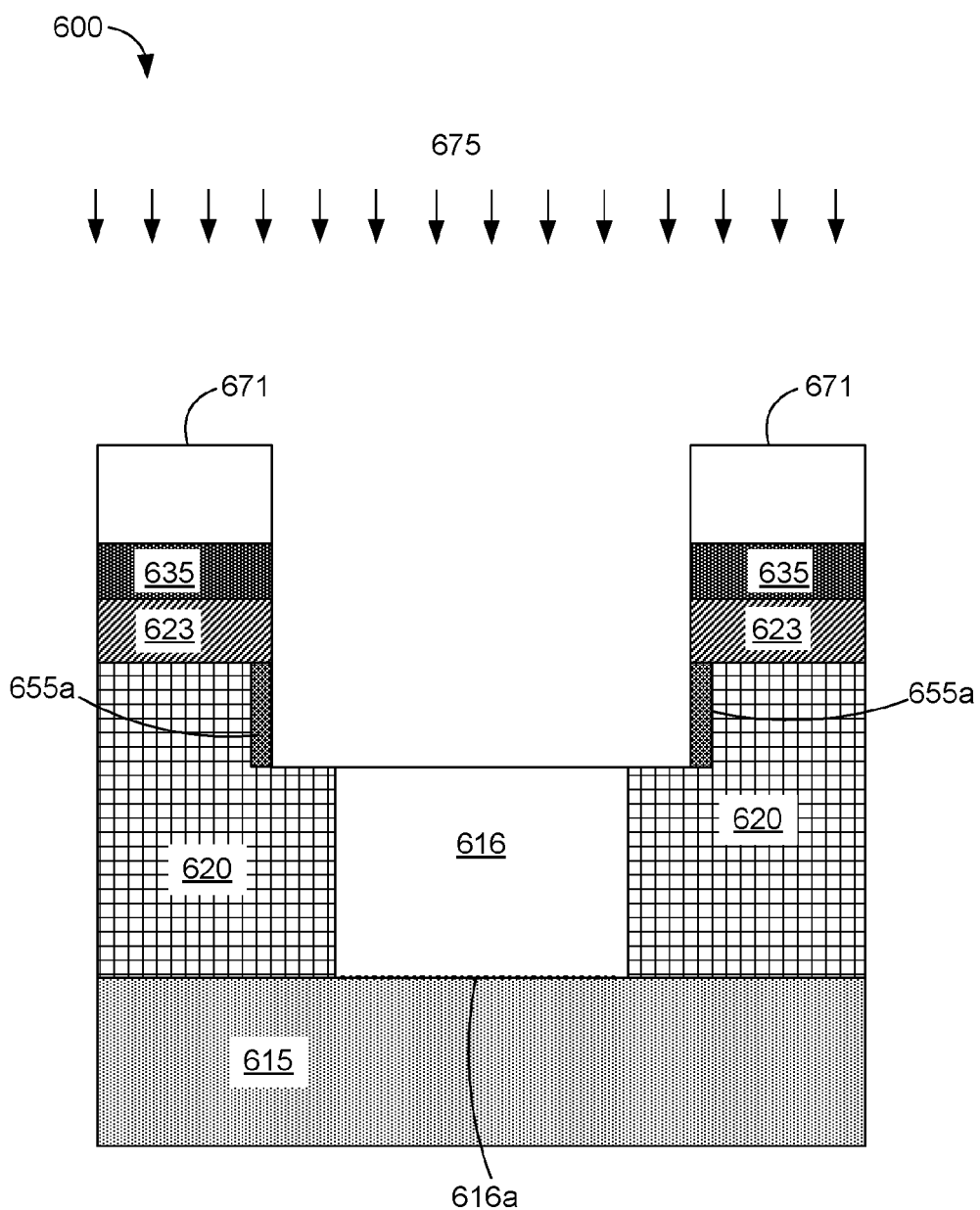
Figure 6G:
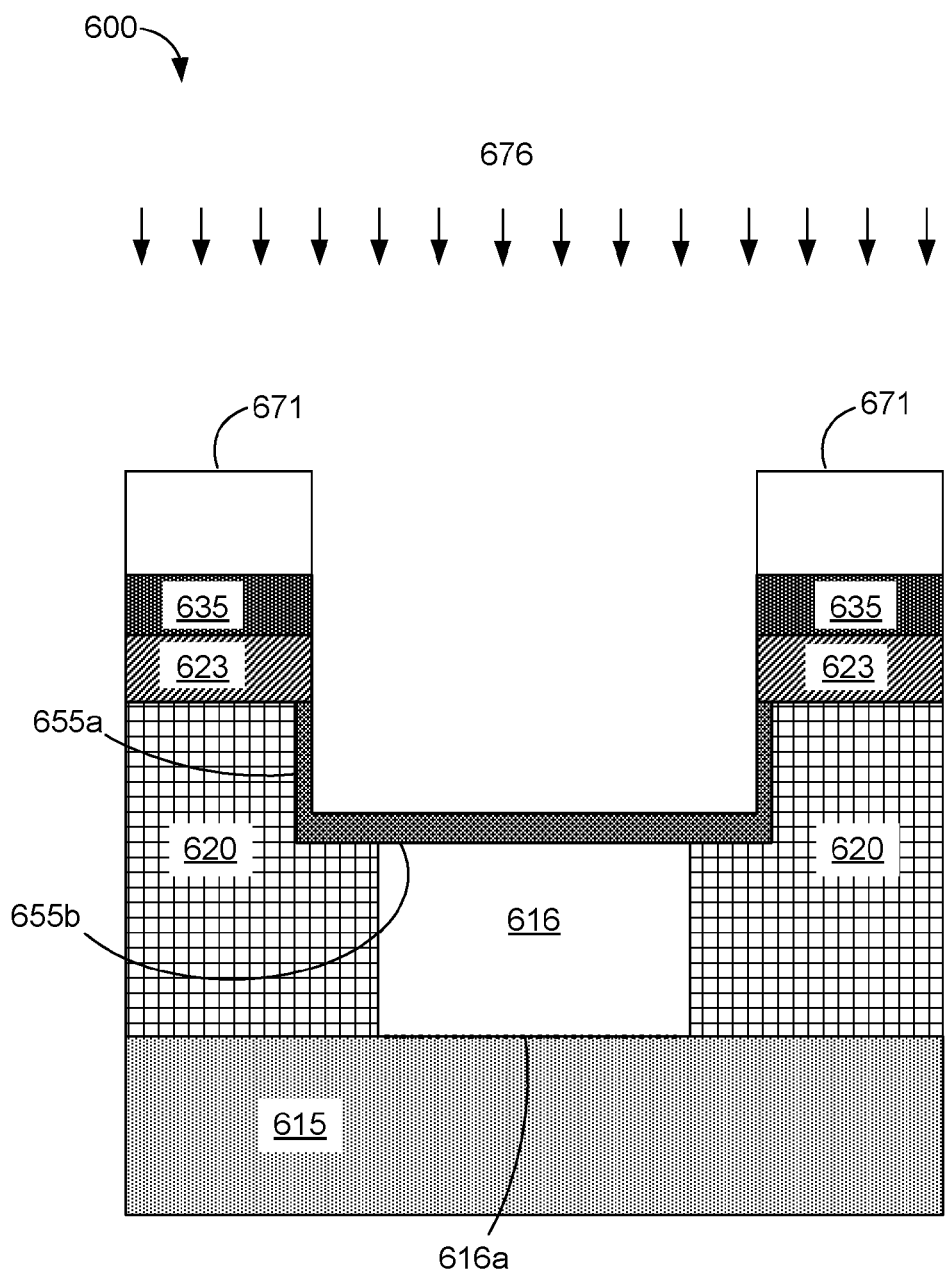
Figure 6H:
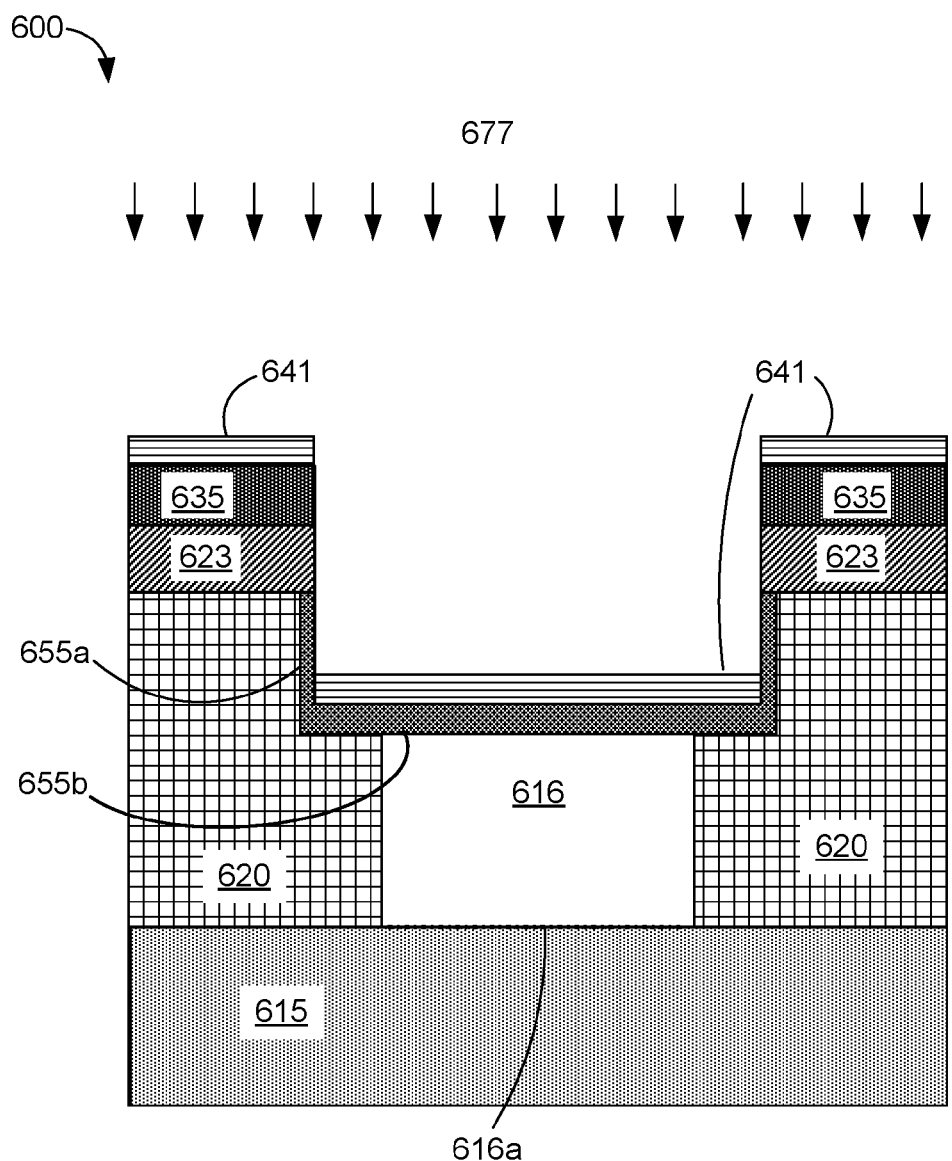
Figure 6I:
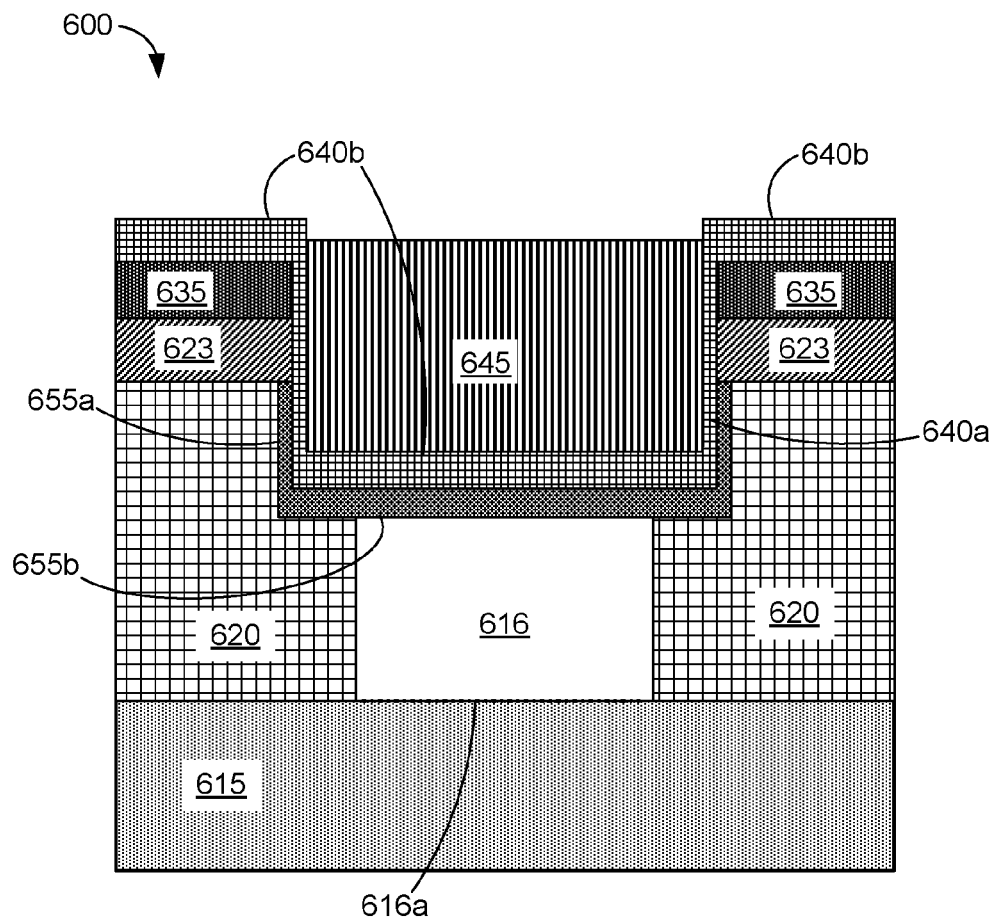
Figure 6J:
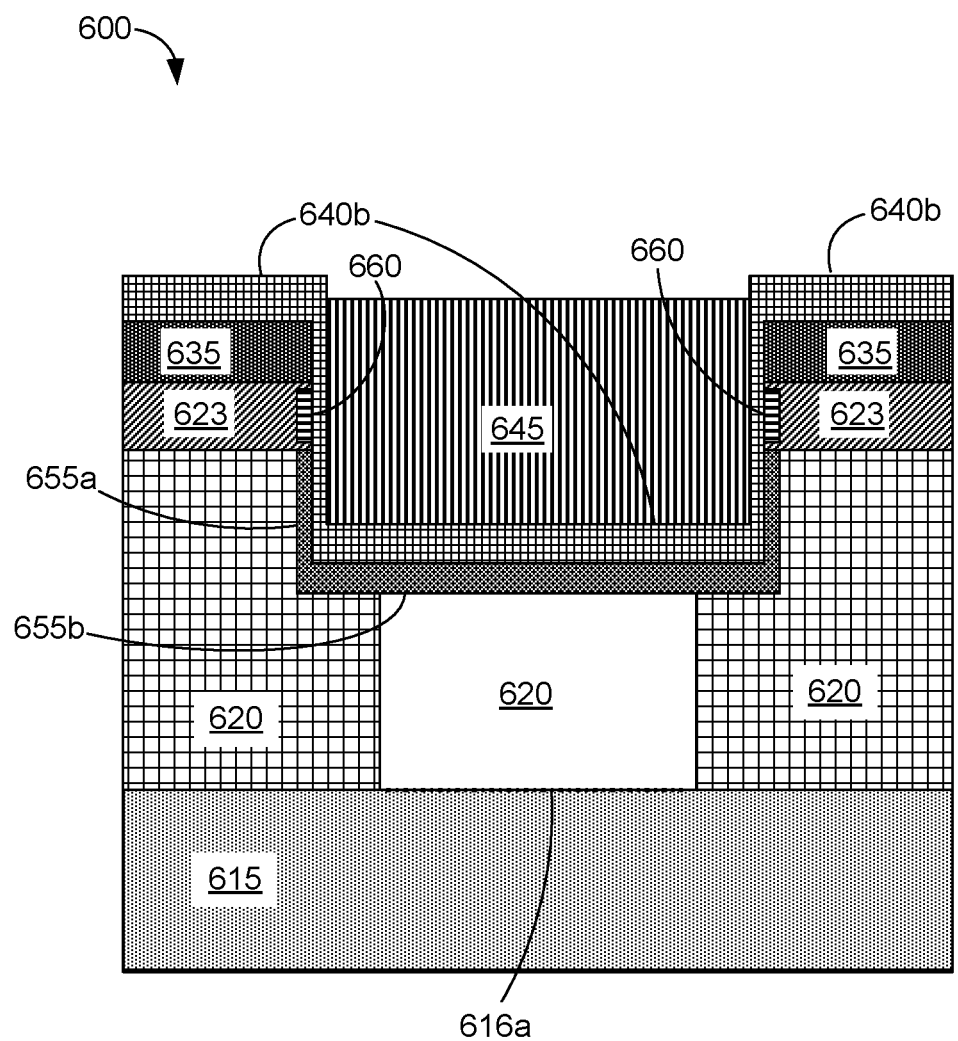

FIGS. 6A-6J are cross-sectional diagrams illustrating semiconductor processing operations for producing a SiC trench gate MOSFET device 600. An example unit cell of the MOSFET device 600 (e.g., a unit cell) is illustrated in FIG. 6J. In this example implementation, the device 600 is formed in hexagonal SiC irrespective of a crystal polarity of an epitaxial wafer used to produce the device 600. In FIG. 6J, only the active semiconductor elements of a unit cell of the device 600 are shown. That is, for example, Ohmic contacts to source and p-body regions are not shown in FIGS. 6A-6J. It will be appreciated, however, that such Ohmic contacts can be implemented in similar fashion as discussed with respect to other implementations described herein. FIGS. 6A-6J also do not show a drain region or a backside drain contact, which can, for example, be arranged in similar manner as the drain region (substrate) 510 and the backside drain contact 505 of the device 500, as shown in FIG. 5I. While the unit cell of the device 600 shown in FIG. 6J is symmetrical, in other implementations, a non-symmetrical device unit cell can be produced.

Referring to FIG. 6J, a MOSFET including a plurality of the unit cells of the device 600 can be controlled (turned on and off) based on a bias applied to a gate electrode 645, where the gate electrode 645 is formed (disposed on) a gate dielectric (gate oxide) within a gate trench. In this example, the gate oxide can include a thin gate dielectric 640a that is disposed on vertical (trench sidewall) portions 655a of a corresponding built-in channel and can also include a thick gate dielectric 640b that is disposed on a lateral portion 655b of the built-in channel of the device 600. A thickness of the thin gate dielectric 640a can be, for example, 50 nm. As discussed above, the device 600 can have an Rox of greater than or equal to 2, corresponding with a thickness of the thick gate dielectric of greater than or equal to 100 nm in this example.

In this example, with a zero or negative bias applied to the gate electrode 645, the device 600 would be in an off-state. In this implementation, a doping concentration of a channel stopper (threshold-voltage control) layer 623 can be implemented at a relatively high level (e.g., as compared to a doping concentration of the shielding p-bodies 620 close to their interface with the channel layer 623. For instance, the channel stopper layer 623 can have a doping concentration of between approximately $1\times10^{17}$ cm$^{-3}$ and $1\times10^{18}$ cm$^{-3}$, which can ensure normally off device operation. When a (high) reverse bias voltage is applied to the drain (not shown), a drift region 615, a JFET channel region 616, and, at least, the lateral portion 655b of the built-in channel 655b of the device 600 would be depleted. Shielding p-bodies 620 of the device 600 can provide electrostatic screening of the gate dielectric (655a, 655b) under high-voltage off-state conditions. Electrically active acceptor dose in the shielding p-bodies 620 can be therefore sufficient for such shielding, where this dose concentration can be in a range between approximately $2\times10^{13}$ cm$^{-3}$ and $1\times10^{14}$ cm$^{-3}$.

Applying a positive bias to a gate electrode 645 of the device 600 will turn on the built-in channel (e.g., 655a, 655b) at the SiC-to-oxide interface, and turn on channel regions 660 in the channel stopper layer 623. As a result of the positive gate bias, the inversion channels 660 will electrically connect n+ source regions 635 to the built-in channel 655, which in FIG. 6J is schematically split into the vertical portions 655a and the lateral portion 655b. This provides a low-resistive current path from the source regions 635 to the drain region (not shown) through the channel regions 660, 655a, 655b, through the n-type vertical JFET region 616, and through the drift region 615. The line 616a in FIG. 6J schematically illustrates a boundary between the drift region 615 and the JFET region 616. The boundary 616a can be merely schematic, as both regions can have identical (substantially identical) doping (e.g., a same doping concentration and/or can be the same epitaxial layer).

Alternatively, the JFET region 616 of the device 600 can have a higher doping concentration than the drift region 615, such as was discussed with respect to the device 500 illustrated in FIGS. 5A-5I. In the device 600, high inversion-layer mobility of SiC at the trench sidewalls (as compared to a planar MOSFET implemented in SiC) will contribute to high on-state conductance of the device 600. The built-in channel portions 655a,655b can have equal mobility, due the fact that bulk mobility in SiC is higher than inversion-channel mobility.

As shown in FIG. 6A, manufacture of the device 600 can start with a substrate having at least one epitaxial layer, which can act as the drift region 615 in the completed device 600. A highly doped n-type source region 635 and a threshold/voltage control p-type layer 623, as shown in FIG. 6A, can be formed epitaxially, by ion implantation, or by a combination of epitaxial formation and ion implantation. As shown in FIG. 6B, shielding p-bodies 620 can be formed by ion implantation using a mask that is defined by photolithography. A portion (between the shielding p-bodies 620) of the epitaxial layer that acts as the drift region 615 can act as the JFET channel region 616 in the completed device 600.

As shown in FIG. 6C, a mask layer 671 can be deposited and patterned by photolithography. The mask 671 can, for example, be formed from silicon dioxide. An anisotropic plasma etch of SiC 672 can then performed to form a gate trench, such as illustrated in FIG. 6C.

Vertical (sidewall) n-type channel portions 655a of the device 600 can then be formed. In this implementation the formation of the vertical channel portions 655a can be accomplished using the semiconductor process operations illustrated in FIGS. 6D, 6E and 6F. As shown in FIGS. 6D and 6E, donor ion implantation can be performed using (opposing) inclined ion implantations beams 673 (FIG. 6D) and 674 (FIG. 6E) to form a channel implant 655c. As illustrated in FIGS. 6D and 6E, the channel implant 655c can first be formed on one side of the trench (FIG. 6D), and then formed on the opposite side of the trench (FIG. 6E). The angled implants 673,674 of FIGS. 6D and 6E can form a continuous n-type channel 655c on a portion of the gate trench surface. However, in this implementation, due to the use of two opposing angled implants (673, 674) the lateral portion of the channel implant 655c can have non-uniform doping due to ion beam shading effects resulting from the angled implants into the gate trench, as can be seen from FIGS. 6D and 6E.

As shown in FIG. 6F, the lateral portion of the channel implant 655c can be removed by an anisotropic plasma etch 675, so as to as to leave only the vertical portions 655a of the channel implant 655c. As illustrated in FIG. 6G, a uniformly doped lateral n-channel portion 655b can then be formed by an ion implant 676. After performing the ion implant 676, the mask layer (e.g., oxide layer) 671 can be removed.

While not shown in FIGS. 6A-6J, implantation of other regions can then be performed, e.g., after removing the making layer 671 and/or forming other masking layers. Such implantations can include forming subcontact regions similar to the subcontact pockets 524 of the device 500. A junction termination region (also not shown) can also be formed. After performing such implantations, all masking materials can be stripped away (removed).

A carbon coating layer, which can clean the upper surface of the device 600 at this stage of processing, can then be deposited and the implanted dopants can be activated by performing a thermal anneal at a temperature of approximately between 1550° C. and 1750° C. The carbon coating can then be removed after the activation anneal.

As shown in FIG. 6H, a layer of silicon dioxide or silicon 641 can then deposited, e.g., using a directed beam 677. Use of the directed beam 677 helps prevent material deposition on the sidewalls of the gate trench, as is show in FIG. 6H. As shown in FIG. 6I, oxidation can then be performed to grow a desired thickness of gate dielectric (gate oxide) 640a on the gate trench sidewalls. This oxidation process can also convert silicon of the layer 641 to $SiO_2$, if silicon-based material is to be used as a (lateral) gate dielectric 640b on the lateral channel portion 655b of the device 600. In some implementations, the lateral gate dielectric 640b can be implemented using a field oxide. As shown in FIG. 6I, the dielectric 640b can also be formed on mesa surfaces adjacent to the gate trench (e.g., as a processing byproduct). The oxidation of FIG. 6I can be followed by an anneal in an ambient containing NO or $N_2O$.

Implementation dependent design and process variations can affect a thickness of the oxide (silicon) layer 641. Anisotropic SiC oxidation can be taken into account for calculation of a desired $SiO_2$ thickness. If, for example, the epitaxial material is a Si-face, then lateral portions of the material portions will oxidize at a much slower rate than the sidewalls. For carbon-face epitaxial structures, oxidation of the lateral material portions will be faster than that of the sidewalls. Further, oxidation of silicon material, such as oxidation of the layer 641 of FIG. 6H, will result in approximately a two-fold volume expansion, which can be considered when determining a desired Rox between a thickness of the lateral gate dielectric 640b and a thickness of the vertical gate dielectric 640a.

As also shown in FIG. 6I, the gate electrode 645 can be formed by deposition of heavily doped polysilicon with a subsequent etch back of the polysilicon to recess the gate electrode 645 in the gate trench, e.g., as it is shown in FIGS. 6I and 6J.

In implementations, the MOSFET designs of the devices 500 and 600 can be modified so as to allow for formation of the respective shielding p-bodies 520 and 620 without using deep implants (e.g., channeled implants). Such modifications can be beneficial from the standpoint of simplifying a corresponding semiconductor production process and reducing associated manufacturing costs.

Figure 7A:
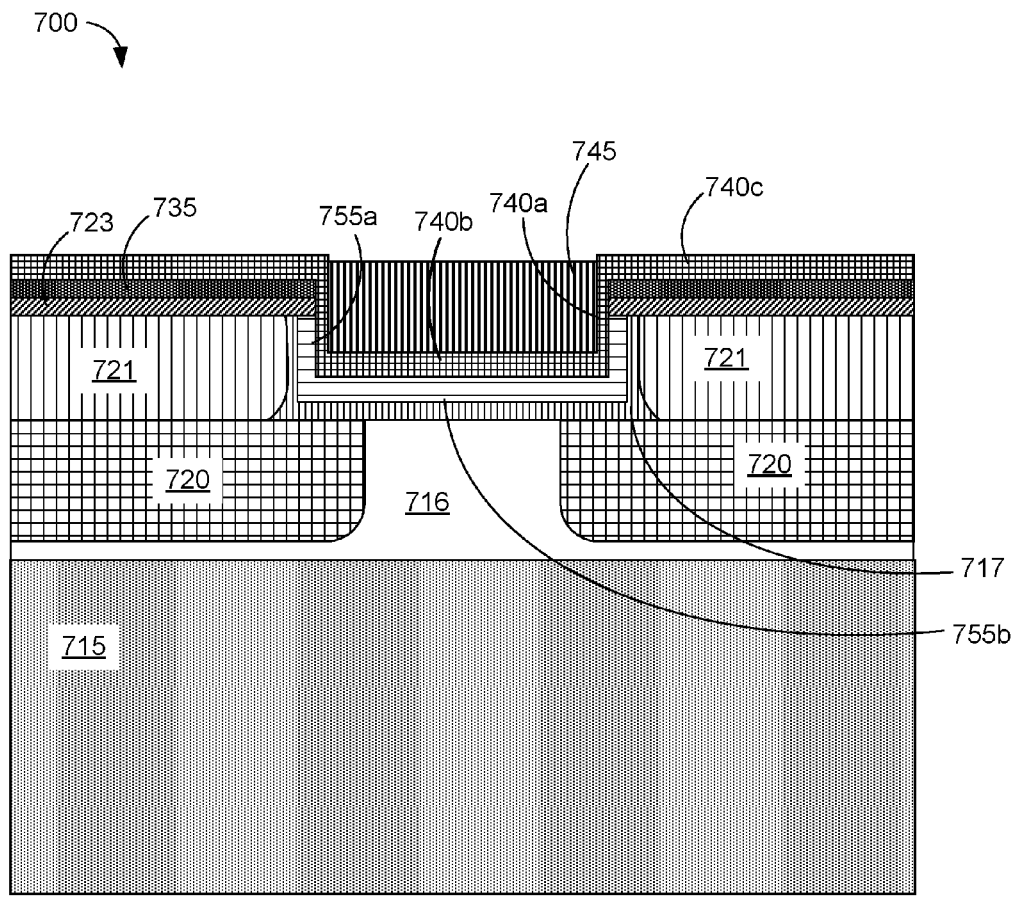
FIG. 7A is a cross-sectional diagram illustrating a SiC trench gate MOSFET device, according to an implementation.
Figure 7B:
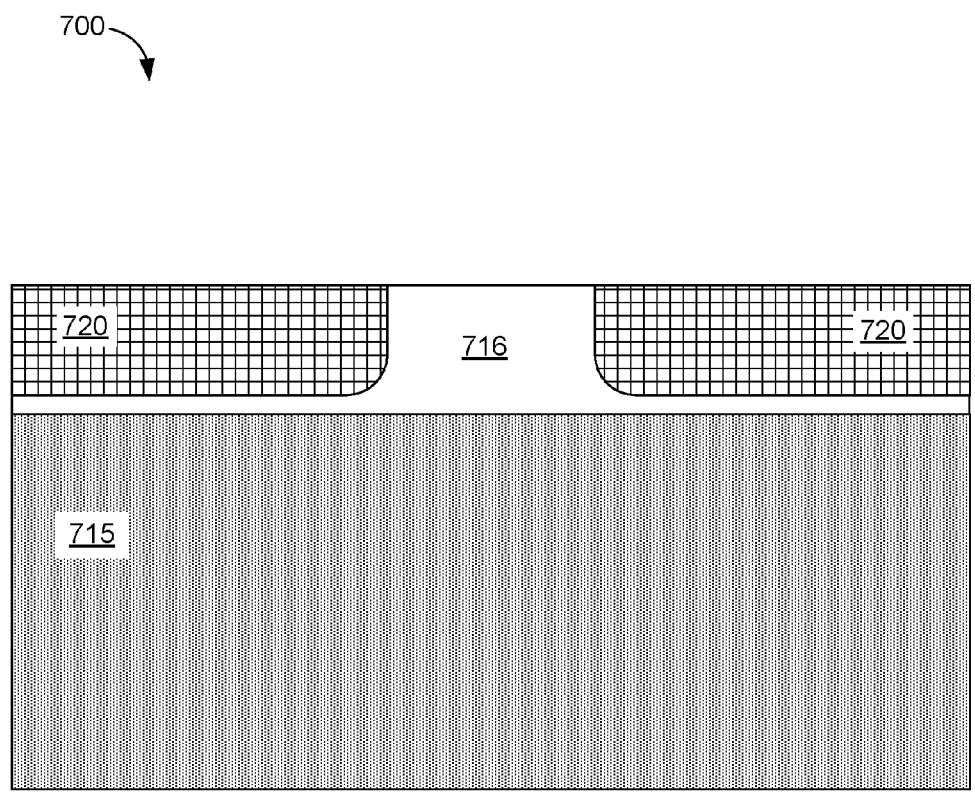
FIGS. 7B-7D are cross-sectional diagrams illustrating semiconductor processing operations that can be used to produce the SiC trench gate MOSFET device of FIG. 7A, according to an implementation.
Figure 7C:
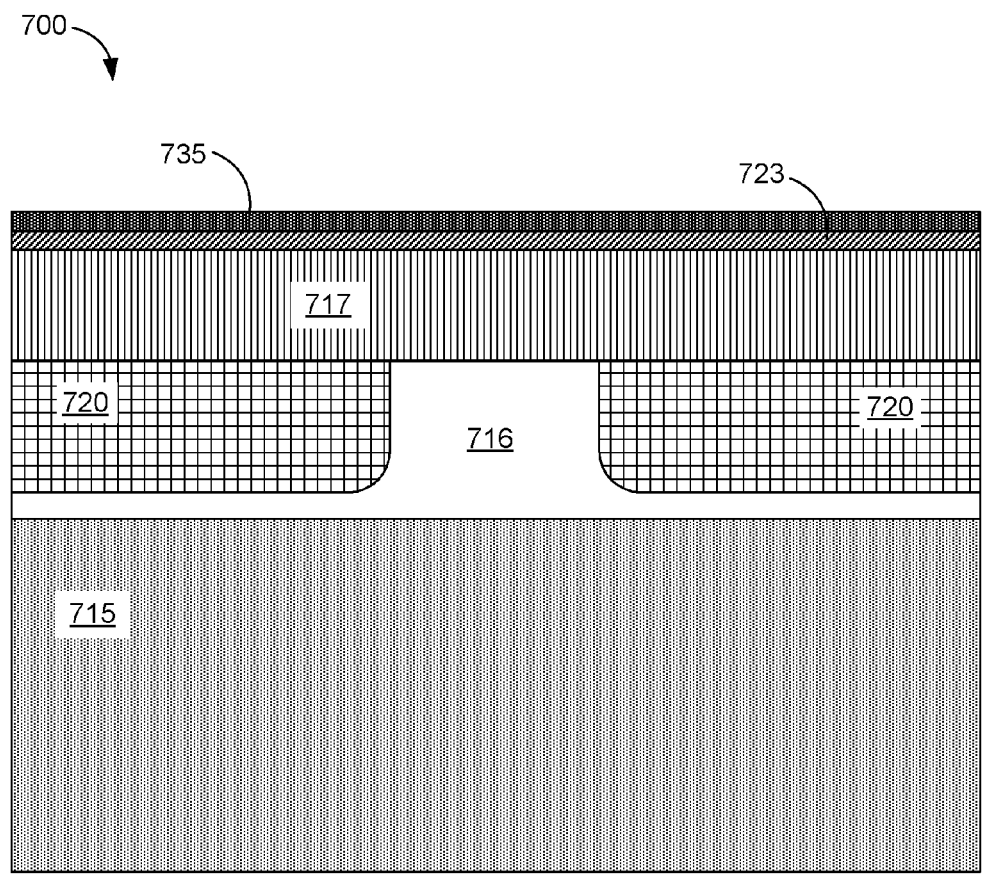
Figure 7D:
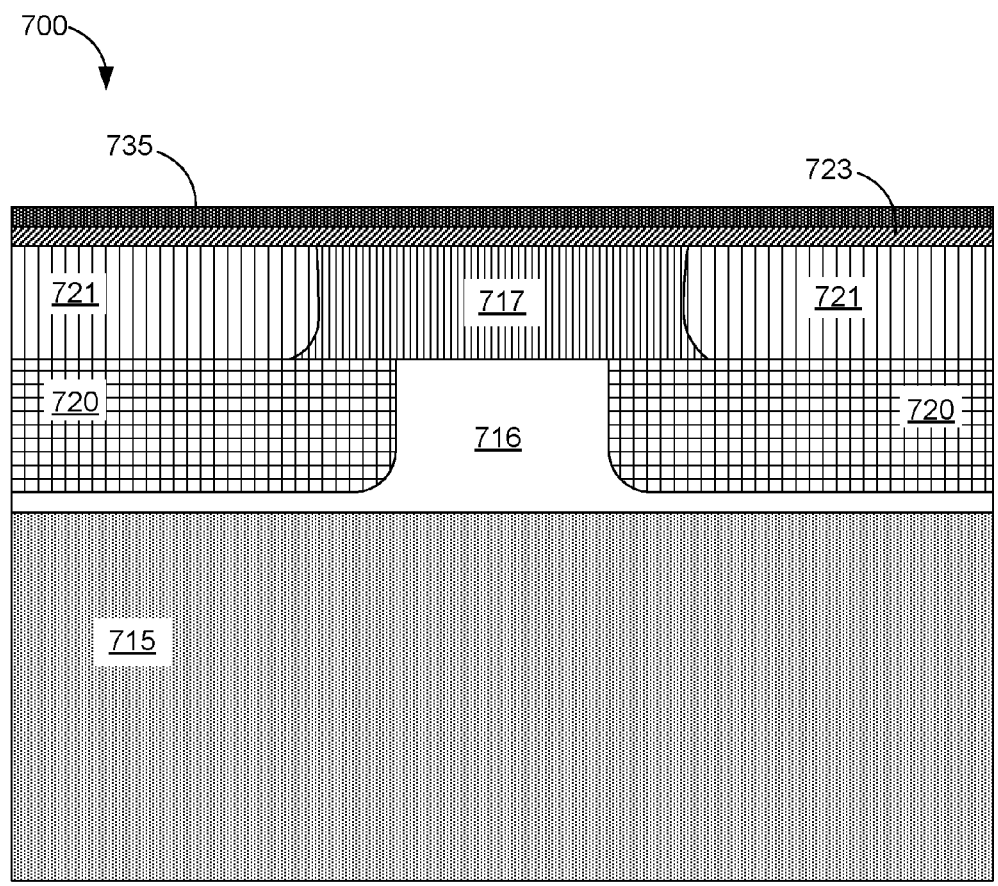

FIG. 7A is a cross-sectional diagram illustrating, e.g., a unit cell (device) 700 of a SiC trench gate MOSFET device, according to an implementation. FIGS. 7B-7D are cross-sectional diagrams illustrating semiconductor processing operations that can be used to produce the device 700 of FIG. 7A, according to an implementation. In the device 700, epitaxial regrowth is used to form deep shielding p-bodies 720,721 (e.g., as an alternative to a channeled implant).

As shown in FIG. 7A, an upper portion of the device 700 that is located above the shielding p-bodies 720 can be formed using epitaxial overgrowth (regrowth). Overall design and operation of the device 700 can be similar to that of the device 600 discussed above. As with the device 600, the device 700 is symmetrical with respect to a vertical center line of the device, though in other implementations, an asymmetric implementation is possible.

Off-state conditions of the device 700 will occur at zero or negative bias applied on a gate electrode 745. At zero (or negative) gate bias, an inversion channel is not formed at the interface of the threshold voltage control (channel stopper) layer 723 to the gate dielectric 740a. Under high-voltage off-state conditions, the p-type shielding bodies 720,721 prevent application of high electric fields to a lateral gate dielectric layer 755b and to the gate electrode 745. Vertical portions 755a and a lateral portion 755b of an n-type built-in channel can be depleted under high-bias off-state conditions. The upper shielding p-bodies 721 can be formed by ion implantation into an overgrown epitaxial layer (e.g., epitaxially overgrown on a JFET layer 716 that is formed by implantation and/or epitaxial growth). The upper shielding p-bodies 721 can ensure that an electric potential of the p-bodies 720 is the same value as that that of p-type threshold voltage control (channel stopper) layer 723. The JFET region (layer) 716 can be an n-type layer and have a similar function as the JFET region 616 of the device 600 as discussed with respect to, for example, FIG. 6I. Region 717 in the device 700 can be n-type and have a same doping concentration as the JFET region 716.

Lateral separation of the upper shielding p-bodies 721 from the built-in channel 755a,755b should be kept small (e.g., between approximately 1 micron and 3 microns) to improve electrostatic shielding (protection) and to limit electric field applied across the vertical gate dielectric (gate oxide) portions 740a. In an implementation, vertical portions of the n-type region 717 adjacent to the upper shielding p-bodies 721 can be depleted under zero-bias conditions.

Under on-state conditions, a positive gate potential of approximately between 10 to 20 Volts can be applied to the gate electrode 745. This positive gate potential can form an inversion channel at the interface of the threshold voltage control layer 723 to the vertical gate dielectric portions 740a. This inversion channel electrically connects the n+ source region 735 to a built-in channel of the device 700, where the built-in channel includes vertical portions 755a and a lateral portion 755b. During the on-state, an electron current can flow from the source regions 735, to the built-in channel (755a,755b), to the n-type layer 717, to the JFET layer 716, to the drift region 715 and to the drain (not shown in FIG. 7A).

A manufacturing process for producing the device 700 can start from an epitaxial structure, such as the epitaxial structure shown in FIG. 7B, which can contain a lightly-doped n-type drift region (epitaxial layer) 715. As with other implementations described herein, the drift region 715 can be grown on top of a heavily doped substrate (not shown). A mask can then be formed, and the shielding p-bodies 720, as defined by the mask, can be formed by ion implantation of acceptors into the drift region 715 to produce the structure as shown in FIG. 7B. The region 716 between adjacent p-bodies 720 can operate as a vertical JFET region in the completed device 700. The region 716 can include additional donor doping (e.g., as compared with the drift region 715) such as was described with respect to the device 500.

As shown in FIG. 7C, epitaxial overgrowth can then be performed to form (grow) the n-type region 717. As also shown in FIG. 7C, a p-type threshold voltage control (channel stopper) layer 723 and a source-region layer 735 can also be formed, such as using the approaches described herein. As shown in FIG. 7D, a p-well implant can then be performed to form the upper shielding p-bodies 721 and to electrically connect the lower shielding p-bodies 720 and the channel stopper layer 723. The manufacturing process beyond this point (e.g., corresponding with the structure shown in FIG. 7D) can be substantially the same as the process described with respect to FIGS. 6C through 6J.

Figure 8A:
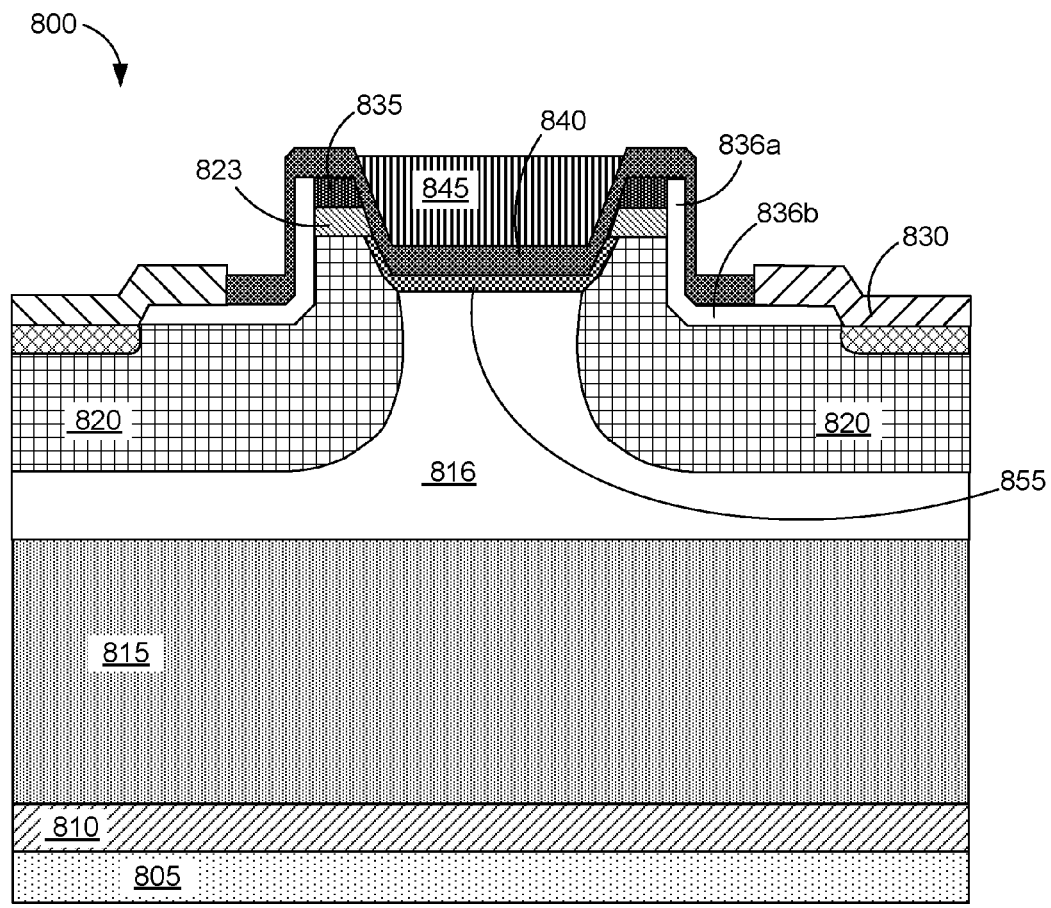
FIG. 8A is a cross-sectional diagram illustrating SiC trench gate MOSFET device, according to an implementation.

FIG. 8A is a cross-sectional diagram illustrating, e.g., a unit cell (device) 800 that can be used to form a SiC trench gate MOSFET device, according to an implementation. FIGS. 8B-8E are cross-sectional diagrams illustrating semiconductor processing operations that can be used to produce the device 800 of FIG. 8A, according to an implementation. As shown in FIG. 8A, the device 800 can include a double trench structure. For instance, in the device 800, a central trench can be used to steer (direct, etc.) source-to-drain current. Further in the device 800, a second trench (or more than one additional trench) can be used to facilitate electrostatic shielding (protection) of a MOSFET channel 855 using deep shielding p-bodies 820.

Operation of the device 800 shown in FIG. 8A is substantially the same as operation of the device 500, such as described above with respect to FIG. 5I. In the device 800, an inversion electron channel can be induced at an interface of the gate dielectric (gate oxide) 840 to the p-type threshold voltage control (channel stopper) layer 823 by applying a positive gate bias to a gate electrode 825. A continuous built-in channel 855 can be formed around the gate oxide layer 840, where the built-in channel 855 and the gate dielectric 840 can be formed using the approaches described herein. In the device 800, the built-in channel 855 can electrically connect the on-state inversion channel (in the channel stopper layer 823) to an n-type JFET region 816. Electron current can flow (from source regions 835), through the inversion channel, through the JFET region 816, through the drift region 815 to the drain 810, which can be implemented by an n+ substrate 810. An Ohmic drain contact 805 can also be disposed on the substrate 810, such as illustrated in FIG. 8A.

As described herein, a thickness of the gate dielectric (gate oxide) 840 on a lateral portion of the gate trench can be at least 2 times greater than that a thickness of the gate dielectric 840 on inclined portions of the central gate trench. This difference in thicknesses (Rox) can decrease a gate capacitance the device 800 and improve reliability of the gate dielectric 840, such as was discussed above with respect to, at least, the device 500.

In the device 800, the shielding trenches (outer trenches) should be positioned in close proximity to the gate trench (central trench). Increased spacing between the trenches is undesirable, as too large of a spacing between these trenches can effect efficiency of electrostatic shielding (protection) of the gate oxide 840. Addressing this design consideration can, however, result in there being limited space (insufficient space) for placing Ohmic contacts on top of the source layer (regions) 835. As shown in FIG. 8A, this concern can be addressed by providing a source link region, where such source link regions can include a vertical portion 836a and a lateral portion 836b. The use of these source link regions can allow for close spacing of gate and shielding trenches in the device 800, because Ohmic source contacts 830 for the device 800 are not formed on top of the mesas between the trenches, but are formed on the lateral portions 836b of the source link regions.

Figure 8B:
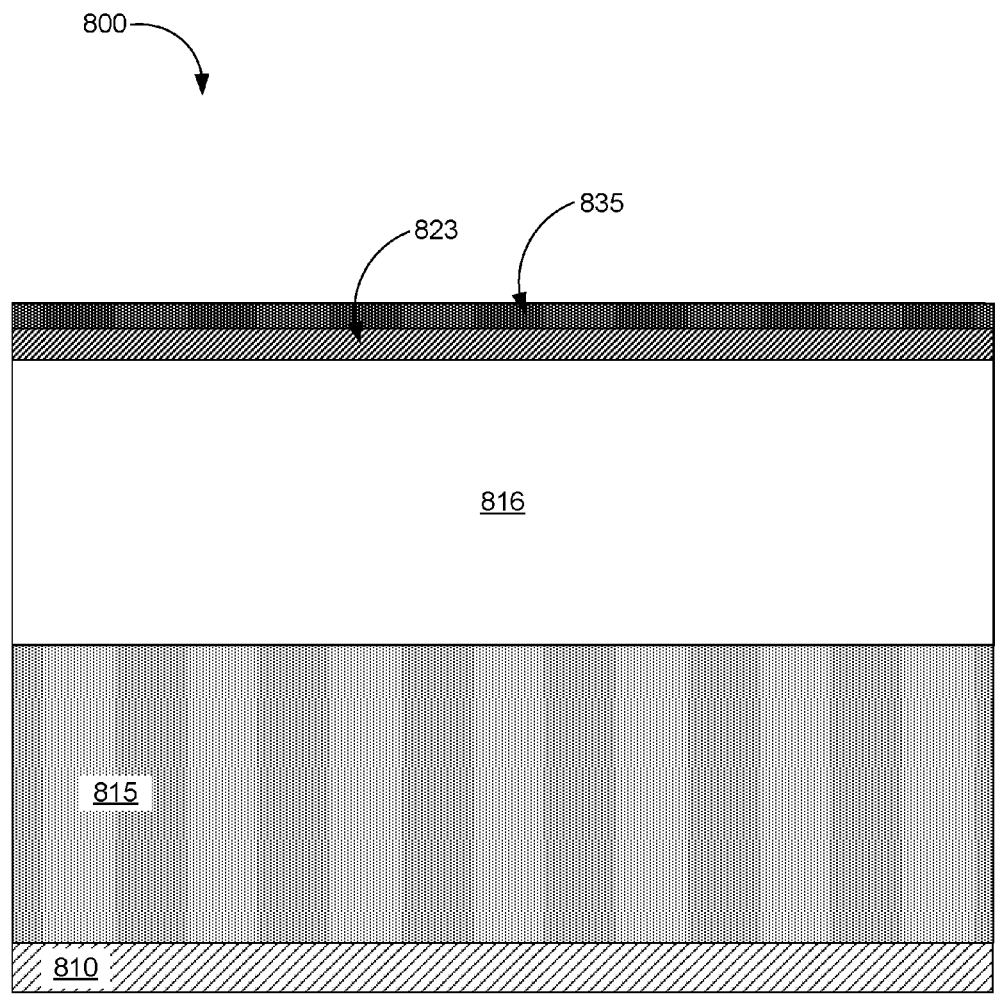
FIGS. 8B-8E are cross-sectional diagrams illustrating semiconductor processing operations that can be used to produce the SiC trench gate MOSFET device of FIG. 8A, according to an implementation.
Figure 8C:
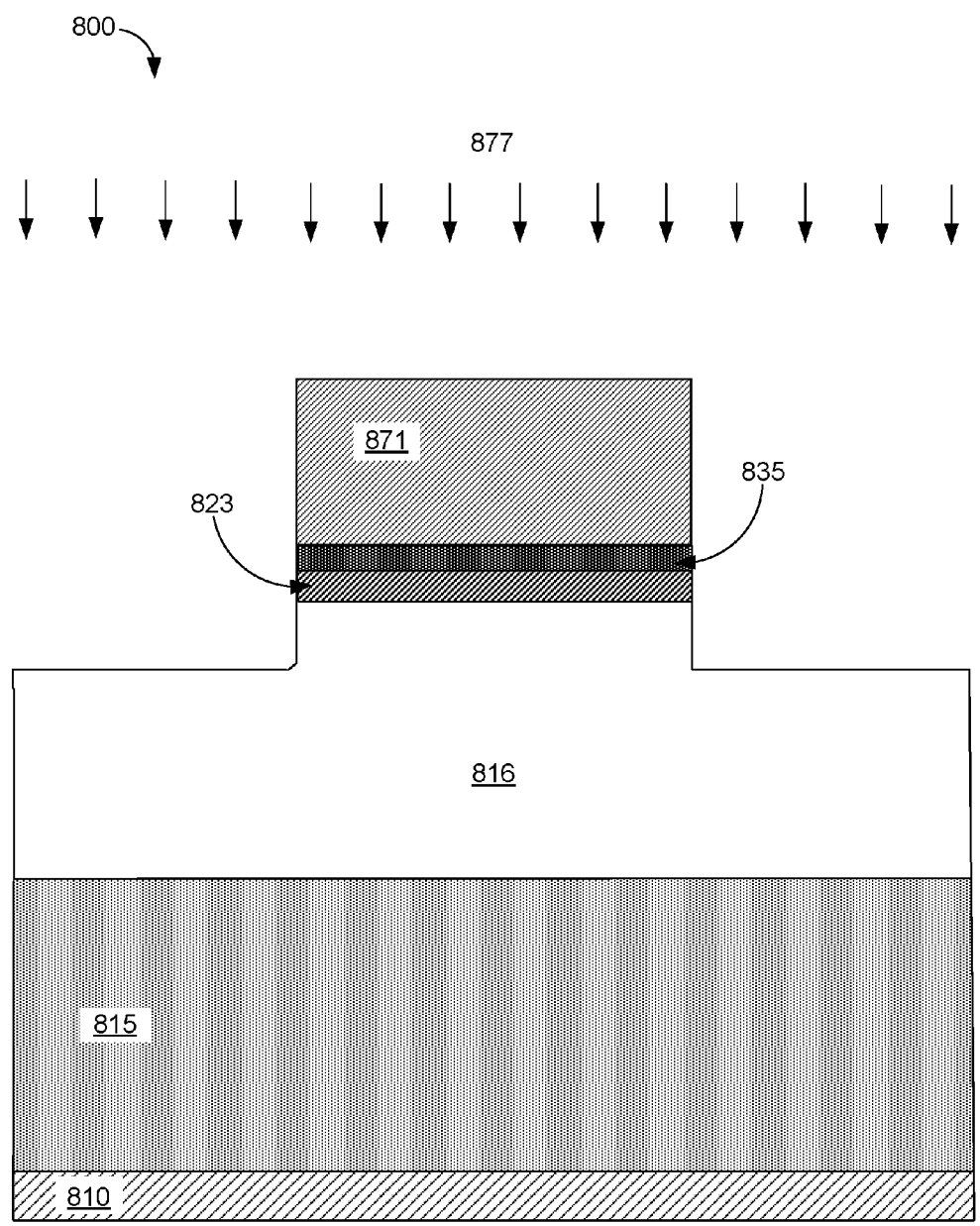
Figure 8D:
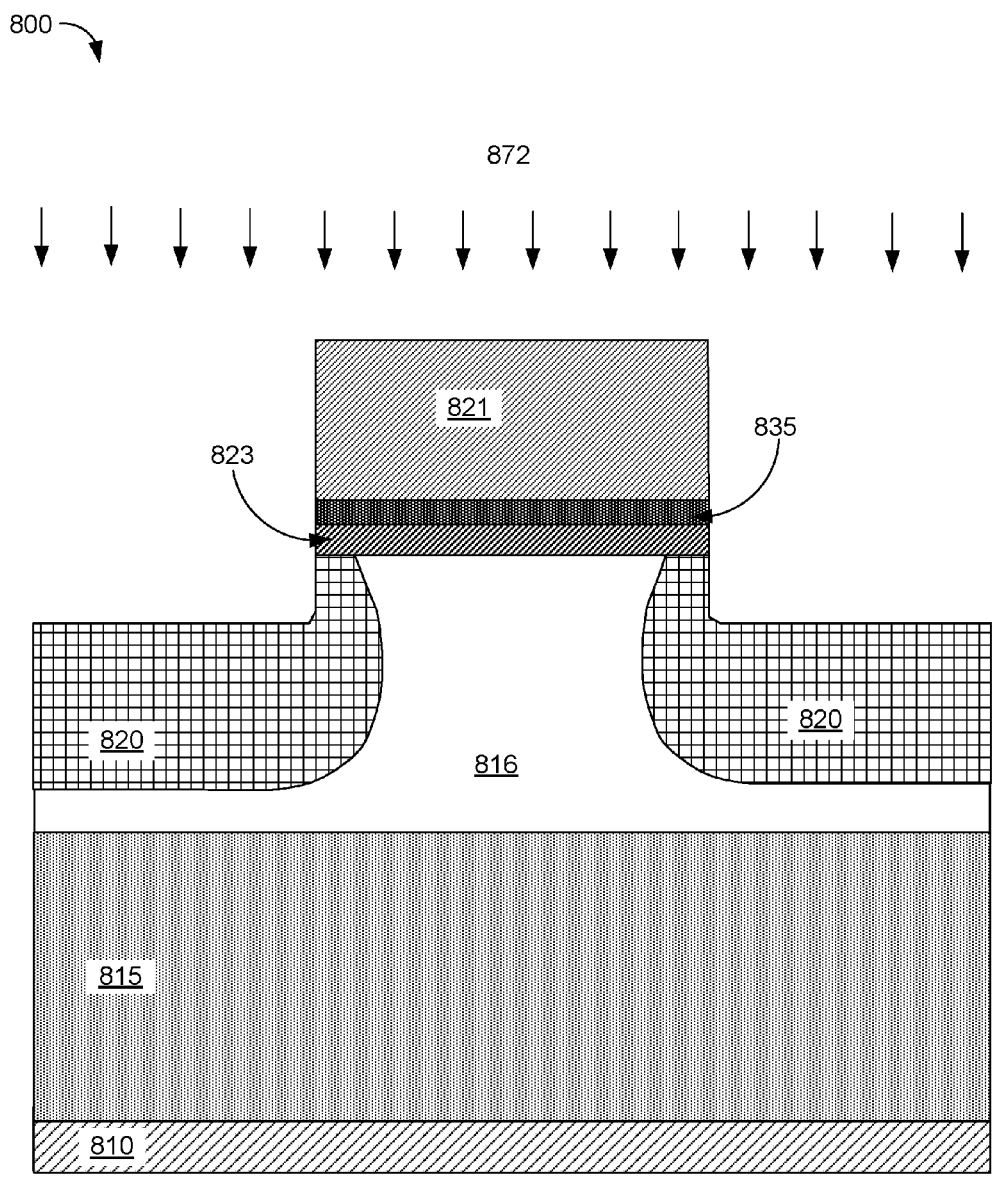
Figure 8E:
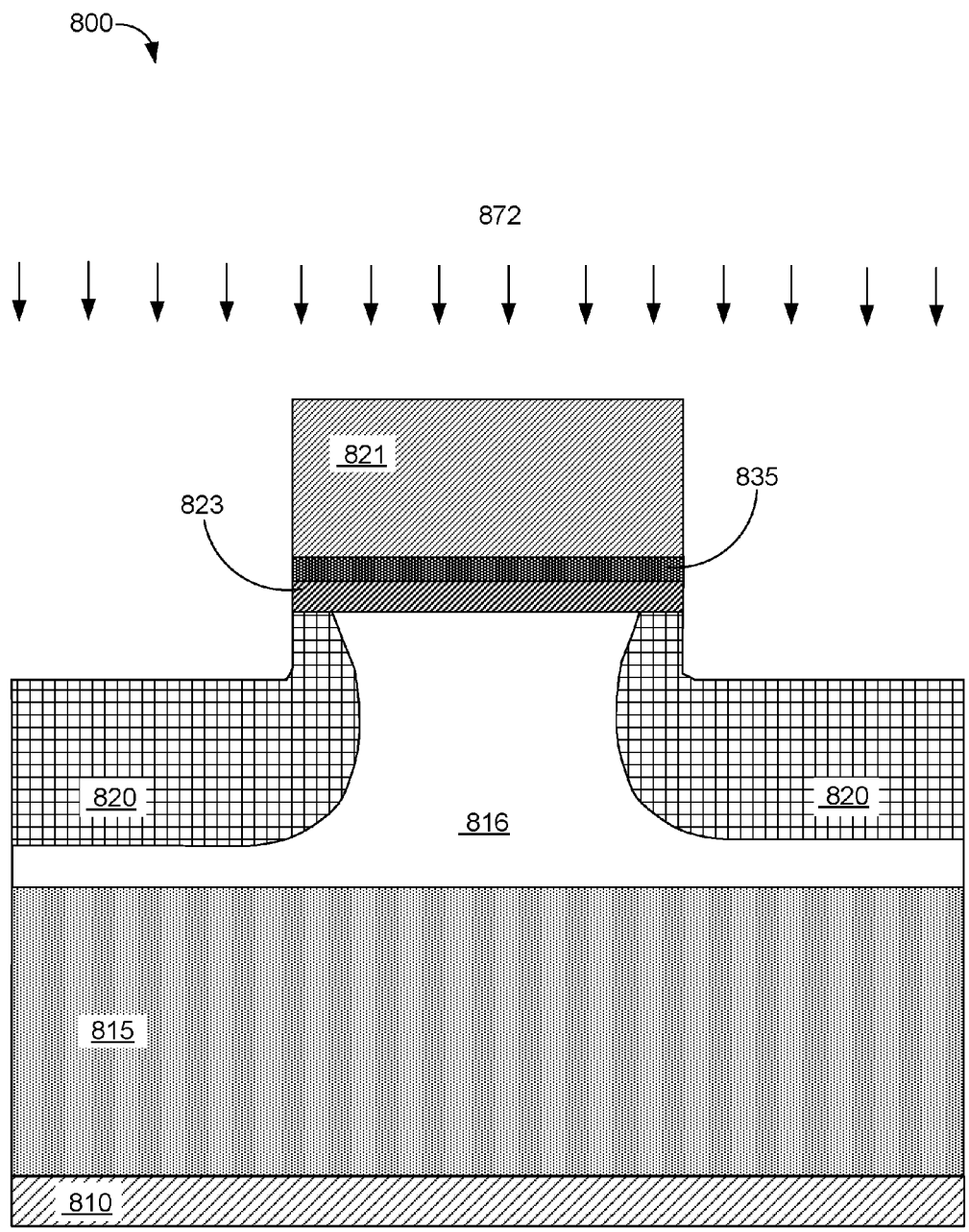

Fabrication of the MOSFET device 800 can start from a same epitaxial structure as fabrication of the device 600, such as the epitaxial structure shown in FIG. 8B. As shown in FIG. 8C, an oxide mask 871 can be deposited and patterned. Shielding trenches can them be formed (e.g., as defined by the oxide mask 871) using a plasma etch, such as an anisotropic RIE etch 877. The RIE etch 877 can be followed by ion implantation of acceptors 872, as shown in FIG. 8D, to form shielding p-bodies 820. The source link 836a, can then be formed using ion implantation with an inclined ion beam 873, as is shown in FIG. 8E. The implantation shown in FIG. 8E may form the vertical source link 836a on only one sidewall of the gate trench. The vertical source link 836a on the other sidewall can then be formed using an implant with an inclination angle that mirrors the inclination angle of the ion beam 873. Further processing can follow with a sequence that is substantially the same as discussed with respect to the device 500 shown in FIGS. 5B through 5I.

In a general aspect, an apparatus can include a silicon-carbide (SiC) substrate of a first conductivity type, a drift region of the first conductivity type disposed on the SiC substrate and a junction field-effect transistor (JFET) channel region of the first conductivity type disposed on the drift region. A shielding body region of a second conductivity type can be disposed in the JFET channel region. A channel stopper layer of the second conductivity type can be disposed on the shielding body region and a source region of the first conductivity type can be disposed on the channel stopper layer. A gate trench can extend through the source region and the channel stopper layer. The gate trench can terminate in the JFET region and have a sidewall and a bottom surface. The apparatus can also include a built-in channel of the first conductivity type disposed below the gate trench. The built-in channel can have a sidewall portion disposed along at least a portion of the sidewall of the gate trench and a lateral portion disposed along at least a portion of the bottom surface of the gate trench. The apparatus can also include a gate dielectric with a sidewall portion disposed on the sidewall of the gate trench and a lateral portion disposed on the bottom surface of the trench. The lateral portion of the gate dielectric can have a thickness that is greater than or equal to two times a thickness of the sidewall portion of the gate dielectric. The apparatus can further include a gate electrode disposed on the gate dielectric.

Implementations can include one or more of the following features. For instance, a doping concentration of the channel stopper layer can be greater than a doping concentration of the shielding body region. A doping concentration of the lateral portion of the built-in channel can be greater than a doping concentration of the sidewall portion of the built-in channel. A threshold voltage of the lateral portion of the built-in channel can be lower than a threshold voltage of the sidewall portion of the built-in channel. The first conductivity type can be n-type and the second conductivity type can be p-type. The built-in channel can continuously extend from the channel stopper layer, through the shielding body region and into the JFET channel region.

The sidewall of the gate trench can define an angle of greater than 90 degrees with the bottom surface of the gate trench. The sidewall of the gate trench can define an angle of approximately 90 degrees with the bottom surface of the gate trench.

The apparatus can include a sub-contact implant region of the second conductivity type disposed in the channel stopper layer. The sub-contact implant region can be disposed adjacent to the source region and the source region can be disposed between the sub-contact implant region and the gate trench. The apparatus can include a contact layer disposed on at least a portion of the sub-contact implant region and disposed on at least a portion of the source region. The contact layer can establish a first ohmic contact with the sub-contact implant region and can establish a second ohmic contact with the source region.

A doping concentration of the JFET channel region can be equal to a doping concentration of the drift region. A doping concentration of the JFET channel region can be greater than a doping concentration of the drift region.

The sidewall portion of the gate dielectric can be disposed, within the gate trench, on the source region, on the channel stopper layer and on at least a portion of the sidewall portion of the built-in channel. The lateral portion of the gate dielectric can be disposed on the lateral portion of the built-in channel.

The gate trench can be a first trench, and the apparatus can include a second trench extending through the source region and the channel stopper layer. The second trench can terminate in the shielding body region. A sub-contact implant region of the second conductivity type can be disposed in the shielding body region. The apparatus can include a linking implant of the first conductivity type. The linking implant can extend from the sub-contact implant region to the source region. The linking implant can have a lateral portion and a vertical portion. A contact layer can be disposed on at least a portion of the sub-contact implant region and can be disposed on at least a portion of the linking implant. The contact layer can establish a first ohmic contact with the sub-contact implant region and can establish a second ohmic contact with the source region via the linking implant.

The shielding body region can include a first shielding body region and a second shielding body region disposed on the first shielding body region. The second shielding body region can be disposed in an epitaxial layer of the first conductivity type that is disposed between the JFET channel region and the channel stopper layer.

In another general aspect, an apparatus can include a silicon-carbide (SiC) substrate of a first conductivity type, a drift region of the first conductivity type disposed in the SiC substrate and a junction field-effect transistor (JFET) channel region of the first conductivity type disposed in the SiC substrate above the drift region. The apparatus can also include a shielding body region of a second conductivity type disposed in the JFET channel region, a channel stopper layer of the second conductivity type disposed on the shielding body region and a source region of the first conductivity type disposed on the channel stopper layer. The apparatus can further include a gate trench extending through the source region and the channel stopper layer. The gate trench can terminate in the JFET region, and can have a sidewall and a bottom surface. The sidewall of the gate trench can define an angle of greater than 90 degrees with the bottom surface of the gate trench. The apparatus can still further include a built-in channel of the first conductivity type disposed below the gate trench. The built-in channel can have a sidewall portion disposed along at least a portion of the sidewall of the gate trench and a lateral portion disposed along at least a portion of the bottom surface of the gate trench. The lateral portion of the built-in channel can have a threshold voltage that is less than a threshold voltage of the sidewall portion of the built-in channel. The apparatus can also include a gate dielectric having a sidewall portion disposed on the sidewall of the gate trench and a lateral portion disposed on the bottom surface of the trench. The lateral portion of the gate dielectric can have a thickness that is greater than or equal to two times a thickness of the sidewall portion of the gate dielectric. The apparatus can also further include a gate electrode disposed on the gate dielectric within the gate trench.

Implementations can include one or more of the following features. For instance, the lateral portion of the gate dielectric can include a field oxide. The thickness of the lateral portion of the gate dielectric can be greater than or equal to three times the thickness of the sidewall portion of the gate dielectric.

The gate trench can be a first trench. The apparatus can include a second trench extending through the source region and the channel stopper layer. The second trench can terminate in the shielding body region. A sub-contact implant region of the second conductivity type can be disposed in the shielding body region. A linking implant of the first conductivity type can extend from the sub-contact implant region to the source region. The linking implant can have a lateral portion and a vertical portion. A contact layer can be disposed on at least a portion of the sub-contact implant region and can be disposed on at least a portion of the linking implant. The contact layer can establish a first ohmic contact with the sub-contact implant region and can establish a second ohmic contact with the source region via the linking implant.

In another general aspect, an apparatus can include a silicon-carbide (SiC) substrate of a first conductivity type, a drift region of the first conductivity type disposed in the SiC substrate and a junction field-effect transistor (JFET) channel region of the first conductivity type disposed in the SiC substrate above the drift region. The apparatus can also include a shielding body region of a second conductivity type disposed in the JFET channel region. The apparatus can further include a channel stopper layer of the second conductivity type disposed on the shielding body region and a source region of the first conductivity type disposed on the channel stopper layer. The apparatus can also further include a gate trench extending through the source region and the channel stopper layer. The gate trench can terminate in the JFET region, and have a sidewall and a bottom surface. The sidewall of the gate trench can define an angle of approximately 90 degrees with the bottom surface of the gate trench. The apparatus can still further include a built-in channel of the first conductivity type disposed below the gate trench. The built-in channel can have a vertical portion disposed along at least a portion of the sidewall of the gate trench and a lateral portion disposed along at least a portion of the bottom surface of the gate trench. The lateral portion of the built-in channel can have a threshold voltage that is less than a threshold voltage of the vertical portion of the built-in channel. The vertical portion of the built-in channel can be disposed below the channel stopper layer. The apparatus can further include a gate dielectric having a sidewall portion disposed on the sidewall of the gate trench and a lateral portion disposed on the bottom surface of the trench. The lateral portion of the gate dielectric can have a thickness that is greater than or equal to two times a thickness of the sidewall portion of the gate dielectric. A gate electrode can be disposed on the gate dielectric within the gate trench.

Implementations can include one or more of the following features. For instance, the shielding body region can include a first shielding body region and a second shield body region disposed on the first shielding body region. The second shielding body region can be disposed in an epitaxial layer of the first conductivity type that is disposed between the JFET channel region and the channel stopper layer.

The various apparatus and techniques described herein may be implemented using various semiconductor processing and/or packaging techniques. While the devices described herein are discussed as being implemented in SiC, in some embodiments, such devices may be implemented using various types of semiconductor processing techniques associated with semiconductor substrates including, but not limited to, for example, Silicon (Si), Galium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the claims, when appended, are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus comprising:
   a silicon-carbide (SiC) substrate of a first conductivity type;
   a drift region of the first conductivity type disposed on the SiC substrate;
   a junction field-effect transistor (JFET) channel region of the first conductivity type disposed on the drift region;
   a shielding body region of a second conductivity type disposed in the JFET channel region;
   a channel stopper layer of the second conductivity type disposed on the shielding body region;
   a source region of the first conductivity type disposed on the channel stopper layer;
   a gate trench extending through the source region and the channel stopper layer, the gate trench terminating in the JFET channel region and having a sidewall and a bottom surface;
   a built-in channel of the first conductivity type disposed below the gate trench, the built-in channel having a sidewall portion disposed along at least a portion of the sidewall of the gate trench and a lateral portion disposed along at least a portion of the bottom surface of the gate trench, the built-in channel having a doping concentration that is different than a doping concentration of the JFET channel region;
   a gate dielectric having a sidewall portion disposed on the sidewall of the gate trench and a lateral portion disposed on the bottom surface of the trench, the lateral portion of the gate dielectric having a thickness that is greater than or equal to two times a thickness of the sidewall portion of the gate dielectric; and
   a gate electrode disposed on the gate dielectric.

2. The apparatus of claim 1, wherein a doping concentration of the channel stopper layer is greater than a doping concentration of the shielding body region.

3. The apparatus of claim 1, wherein a doping concentration of the lateral portion of the built-in channel is greater than a doping concentration of the sidewall portion of the built-in channel.

4. The apparatus of claim 1, wherein a threshold voltage of the lateral portion of the built-in channel is lower than a threshold voltage of the sidewall portion of the built-in channel.

5. The apparatus of claim 1, wherein the first conductivity type is n-type and the second conductivity type is p-type.

6. The apparatus of claim 1, wherein the built-in channel continuously extends from the channel stopper layer, through the shielding body region and into the JFET channel region.

7. The apparatus of claim 1, wherein the sidewall of the gate trench defines an angle of greater than 90 degrees with the bottom surface of the gate trench.

8. The apparatus of claim 1, wherein the sidewall of the gate trench defines an angle of approximately 90 degrees with the bottom surface of the gate trench.

9. The apparatus of claim 1, further comprising:
   a sub-contact implant region of the second conductivity type disposed in the channel stopper layer, the sub-contact implant region being disposed adjacent to the source region, the source region being disposed between the sub-contact implant region and the gate trench; and
   a contact layer disposed on at least a portion of the sub-contact implant region and disposed on at least a portion of the source region, the contact layer establishing a first ohmic contact with the sub-contact implant region and a second ohmic contact with the source region.

10. The apparatus of claim 1, wherein a doping concentration of the JFET channel region is equal to a doping concentration of the drift region.

11. The apparatus of claim 1, wherein a doping concentration of the JFET channel region is greater than a doping concentration of the drift region.

12. The apparatus of claim 1, wherein:
   the sidewall portion of the gate dielectric is disposed, within the gate trench, on the source region, on the channel stopper layer and on at least a portion of the sidewall portion of the built-in channel; and
   the lateral portion of the gate dielectric is disposed on the lateral portion of the built-in channel.

13. The apparatus of claim 1, wherein the gate trench is a first trench, the apparatus further comprising:
   a second trench extending through the source region and the channel stopper layer, the second trench terminating in the shielding body region;
   a sub-contact implant region of the second conductivity type disposed in the shielding body region;
   a linking implant of the first conductivity type, the linking implant extending from the sub-contact implant region to the source region, the linking implant having a lateral portion and a vertical portion; and a contact layer disposed on at least a portion of the sub-contact implant region and disposed on at least a portion of the linking implant, the contact layer establishing a first ohmic contact with the sub-contact implant region and a second ohmic contact with the source region via the linking implant.

14. The apparatus of claim 1, wherein the shielding body region includes a first shielding body region and a second shielding body region disposed on the first shielding body region, the second shielding body region being disposed in an epitaxial layer of the first conductivity type that is disposed between the JFET channel region and the channel stopper layer.

15. An apparatus comprising:
a silicon-carbide (SiC) substrate of a first conductivity type;
a drift region of the first conductivity type disposed in the SiC substrate;
a junction field-effect transistor (JFET) channel region of the first conductivity type disposed in the SiC substrate above the drift region;
a shielding body region of a second conductivity type disposed in the JFET channel region;
a channel stopper layer of the second conductivity type disposed on the shielding body region;
a source region of the first conductivity type disposed on the channel stopper layer;
a gate trench extending through the source region and the channel stopper layer, the gate trench terminating in the JFET channel region and having a sidewall and a bottom surface, the sidewall of the gate trench defining an angle of greater than 90 degrees with the bottom surface of the gate trench;
a built-in channel of the first conductivity type disposed below the gate trench, the built-in channel having a sidewall portion disposed along at least a portion of the sidewall of the gate trench and a lateral portion disposed along at least a portion of the bottom surface of the gate trench, the lateral portion of the built-in channel having a threshold voltage that is less than a threshold voltage of the sidewall portion of the built-in channel;
a gate dielectric having a sidewall portion disposed on the sidewall of the gate trench and a lateral portion disposed on the bottom surface of the trench, the lateral portion of the gate dielectric having a thickness that is greater than or equal to two times a thickness of the sidewall portion of the gate dielectric; and
a gate electrode disposed on the gate dielectric within the gate trench.

16. The apparatus of claim 15, wherein the lateral portion of the gate dielectric includes a field oxide.

17. The apparatus of claim 15, wherein the thickness of the lateral portion of the gate dielectric is greater than or equal to three times the thickness of the sidewall portion of the gate dielectric.

18. The apparatus of claim 15, wherein the gate trench is a first trench, the apparatus further comprising:
a second trench extending through the source region and the channel stopper layer, the second trench terminating in the shielding body region;

a sub-contact implant region of the second conductivity type disposed in the shielding body region;
a linking implant of the first conductivity type, the linking implant extending from the sub-contact implant region to the source region, the linking implant having a lateral portion and a vertical portion; and
a contact layer disposed on at least a portion of the sub-contact implant region and disposed on at least a portion of the linking implant, the contact layer establishing a first ohmic contact with the sub-contact implant region and a second ohmic contact with the source region via the linking implant.

19. An apparatus comprising:
a silicon-carbide (SiC) substrate of a first conductivity type;
a drift region of the first conductivity type disposed in the SiC substrate;
a junction field-effect transistor (JFET) channel region of the first conductivity type disposed in the SiC substrate above the drift region;
a shielding body region of a second conductivity type disposed in the JFET channel region;
a channel stopper layer of the second conductivity type disposed on the shielding body region;
a source region of the first conductivity type disposed on the channel stopper layer;
a gate trench extending through the source region and the channel stopper layer, the gate trench terminating in the JFET channel region and having a sidewall and a bottom surface, the sidewall of the gate trench defining an angle of approximately 90 degrees with the bottom surface of the gate trench;
a built-in channel of the first conductivity type disposed below the gate trench, the built-in channel having a vertical portion disposed along at least a portion of the sidewall of the gate trench and a lateral portion disposed along at least a portion of the bottom surface of the gate trench, the lateral portion of the built-in channel having a threshold voltage that is less than a threshold voltage of the vertical portion of the built-in channel, the vertical portion of the built-in channel being disposed below the channel stopper layer;
a gate dielectric having a sidewall portion disposed on the sidewall of the gate trench and a lateral portion disposed on the bottom surface of the trench, the lateral portion of the gate dielectric having a thickness that is greater than or equal to two times a thickness of the sidewall portion of the gate dielectric; and
a gate electrode disposed on the gate dielectric within the gate trench.

20. The apparatus of claim 19, wherein the shielding body region includes a first shielding body region and a second shield body region disposed on the first shielding body region, the second shielding body region being disposed in an epitaxial layer of the first conductivity type that is disposed between the JFET channel region and the channel stopper layer.

21. The apparatus of claim 1, wherein the built-in channel is formed by donor ion implantation into the sidewall of the gate trench and the bottom surface of the gate trench.

* * * * *